(12) United States Patent
Alasaarela et al.

(10) Patent No.: US 7,270,428 B2
(45) Date of Patent: Sep. 18, 2007

(54) 2D/3D DATA PROJECTOR

(75) Inventors: Mikko Petteri Alasaarela, Oulu (FI);
Ilkka Antero Alasaarela, Oulu (FI)

(73) Assignee: Upstream Engineering Oy, Oulu (FI)

( * ) Notice: Subject to any disclaimer, the term of this patent is extended or adjusted under 35 U.S.C. 154(b) by 0 days.

(21) Appl. No.: 11/407,829

(22) Filed: Apr. 18, 2006

(65) Prior Publication Data

US 2006/0215129 A1 Sep. 28, 2006

Related U.S. Application Data

(63) Continuation of application No. 10/622,296, filed on Jul. 17, 2003, now Pat. No. 7,059,728.

(30) Foreign Application Priority Data

Apr. 16, 2003 (FI) ................................. 20030583

(51) Int. Cl.
*F21V 7/22* (2006.01)
(52) U.S. Cl. ........................ 353/122; 313/512; 362/555
(58) Field of Classification Search .................. 353/31, 353/34, 37, 94, 122, 98, 99; 349/5, 7, 8, 349/9; 348/801, 800, 802; 345/45, 46, 82, 345/83; 359/558–576; 362/555, 561; 313/498, 313/499, 500, 502, 512
See application file for complete search history.

(56) References Cited

U.S. PATENT DOCUMENTS

| | | | |
|---|---|---|---|
| 3,834,789 A | 9/1974 | Brudy ........................... | 350/97 |
| 5,008,496 A | 4/1991 | Schmidt et al. .............. | 174/254 |
| 5,121,983 A | 6/1992 | Lee ................................. | 353/8 |
| 5,398,086 A | 3/1995 | Nakano et al. ................ | 353/31 |
| 5,825,741 A | 10/1998 | Welch et al. ................. | 369/112 |
| 5,971,545 A | 10/1999 | Haitz ............................ | 353/31 |
| 6,021,106 A | 2/2000 | Welch et al. ................. | 369/112 |
| 6,155,699 A * | 12/2000 | Miller et al. .................. | 362/293 |
| 6,407,868 B1 | 6/2002 | Ishibashi et al. ............. | 359/634 |
| 6,416,182 B1 | 7/2002 | Kakuda et al. ................ | 353/20 |
| 6,542,298 B1 | 4/2003 | Aoki ............................ | 359/483 |
| 6,547,400 B1 | 4/2003 | Yokohama ..................... | 353/98 |
| 6,686,676 B2 * | 2/2004 | McNulty et al. .............. | 313/112 |
| 6,686,691 B1 * | 2/2004 | Mueller et al. .............. | 313/503 |
| 6,726,329 B2 | 4/2004 | Li et al. ......................... | 353/20 |
| 6,791,259 B1 * | 9/2004 | Stokes et al. ................ | 313/503 |
| 6,791,756 B2 | 9/2004 | Swanson ...................... | 359/567 |
| 6,799,849 B2 | 10/2004 | Kim et al. ...................... | 353/30 |

(Continued)

FOREIGN PATENT DOCUMENTS

EP 080 7832 A2 11/1997

(Continued)

*Primary Examiner*—William C. Dowling
(74) *Attorney, Agent, or Firm*—Harrington & Smith, PC

(57) ABSTRACT

The present solution relates to a 2D/3D data projector, which comprises: A data projector, the data projector comprising: at least one micro display having an image to be projected, at least one source unit comprising at least one light source chip and at least one beam forming component, each beam forming component comprising at least one diffractive element, and each source unit being designed to preserve etendue as far as possible, to minimize photon loss, to provide a desired projection shape and a uniform illumination onto the micro display, and a focusing optical unit for projecting the image of the micro display on a target.

19 Claims, 23 Drawing Sheets

U.S. PATENT DOCUMENTS

Figures 1A, 1B:
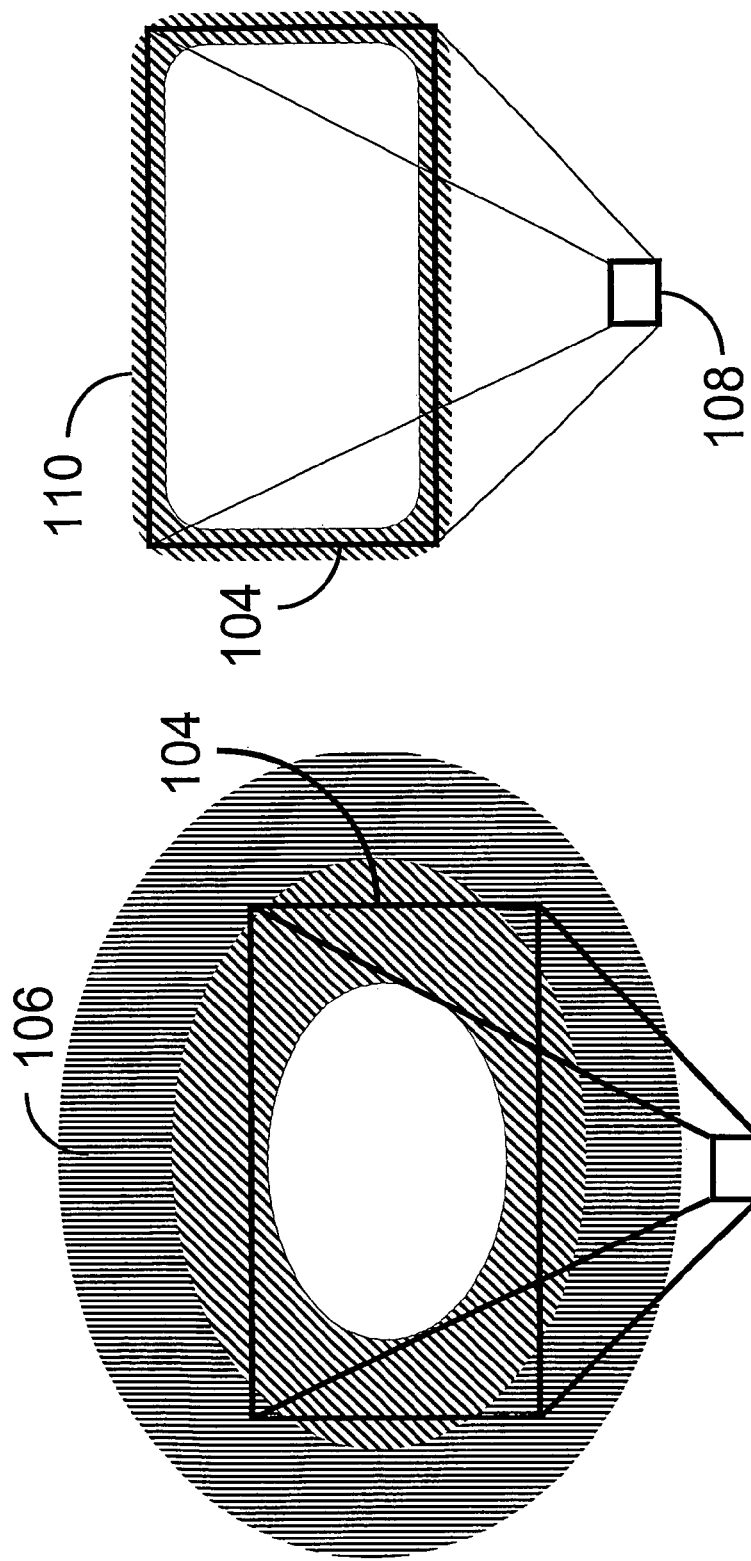

| | | | |
|---|---|---|---|
| 6,860,621 B2 | 3/2005 | Bachl et al. | 362/373 |
| 6,871,982 B2 | 3/2005 | Holman et al. | 362/331 |
| 2002/0145708 A1 | 10/2002 | Childers et al. | 353/85 |
| 2002/0171938 A1 | 11/2002 | Nakajo et al. | 359/625 |
| 2002/0180351 A1* | 12/2002 | McNulty et al. | 313/512 |
| 2004/0057027 A1 | 3/2004 | Tani | 353/102 |
| 2004/0207816 A1 | 10/2004 | Omoda et al. | 353/31 |
| 2004/0207823 A1 | 10/2004 | Alasaarela et al. | 353/122 |
| 2004/0219464 A1 | 11/2004 | Dunham et al. | 430/320 |
| 2005/0018141 A1 | 1/2005 | Hosaka | 353/31 |
| 2005/0173048 A1* | 8/2005 | Alasaarela et al. | 156/227 |
| 2006/0139575 A1* | 6/2006 | Alasaarela et al. | 353/31 |

FOREIGN PATENT DOCUMENTS

| | | |
|---|---|---|
| GB | 1 211 027 | 11/1970 |
| JP | 04229244 | 8/1992 |
| JP | 10186112 | 7/1998 |
| WO | WO-94/22048 | 9/1994 |
| WO | WO-97/01128 | 1/1997 |
| WO | WO-03/005733 | 1/2003 |

* cited by examiner

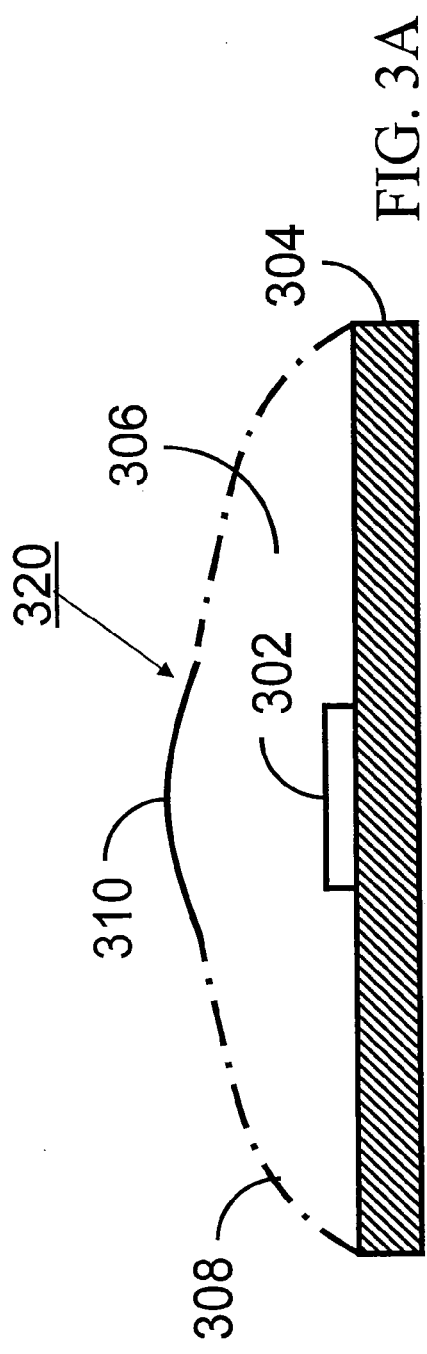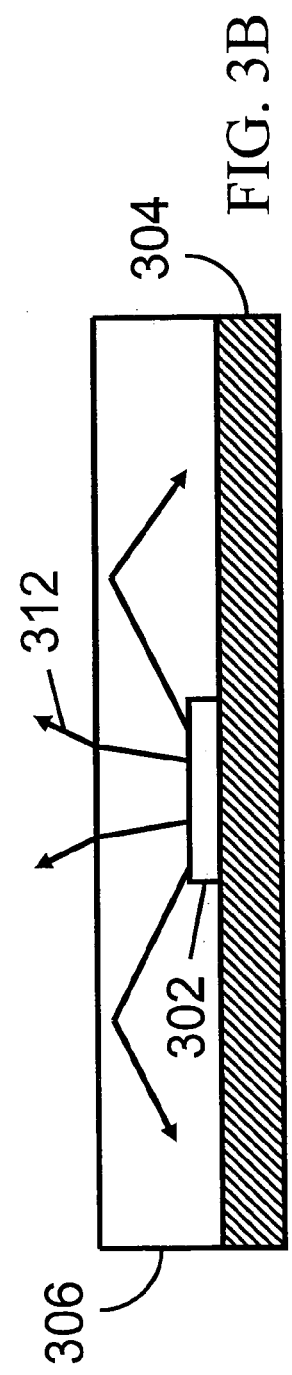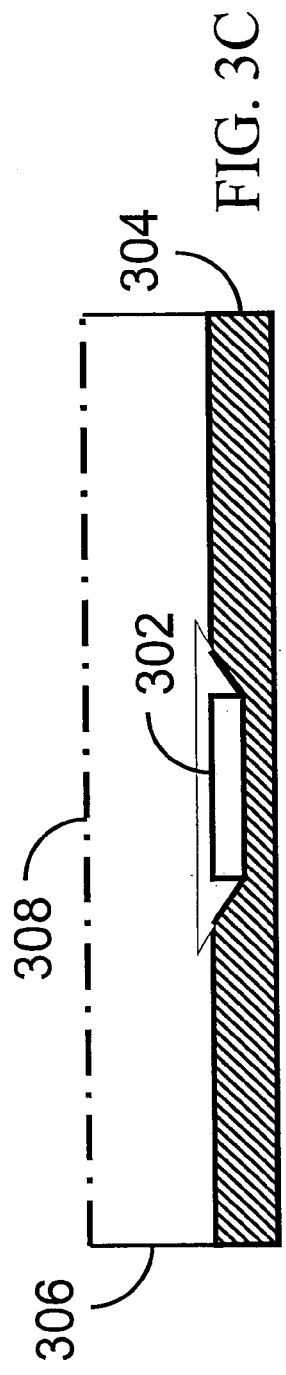
FIG. 3A
FIG. 3B
FIG. 3C

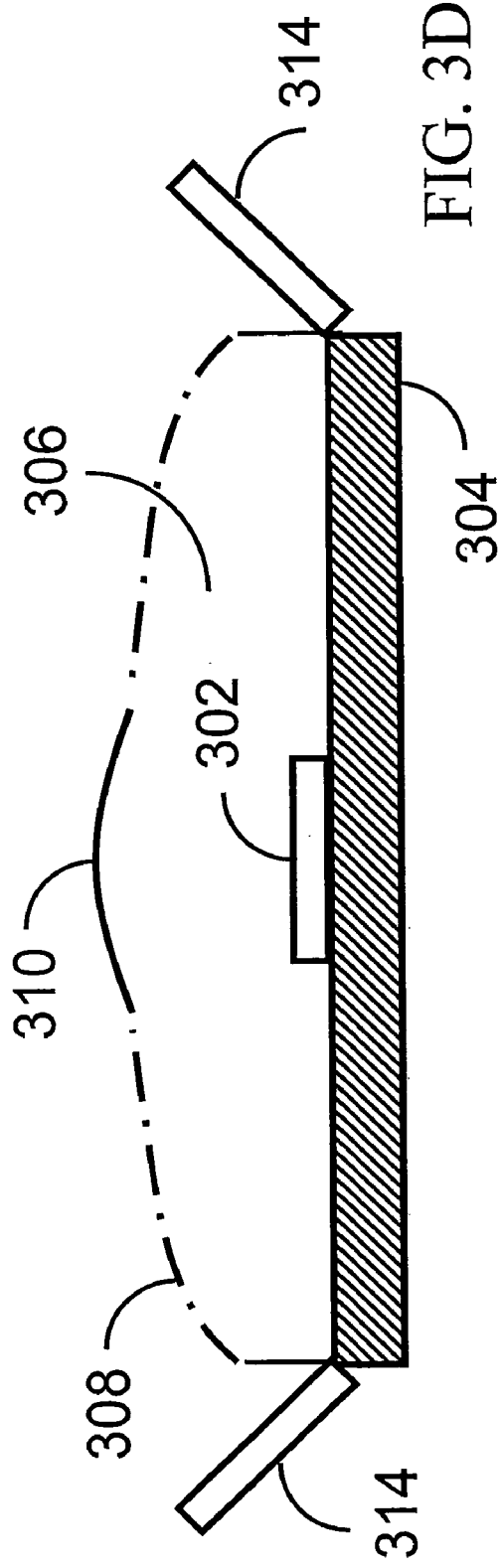
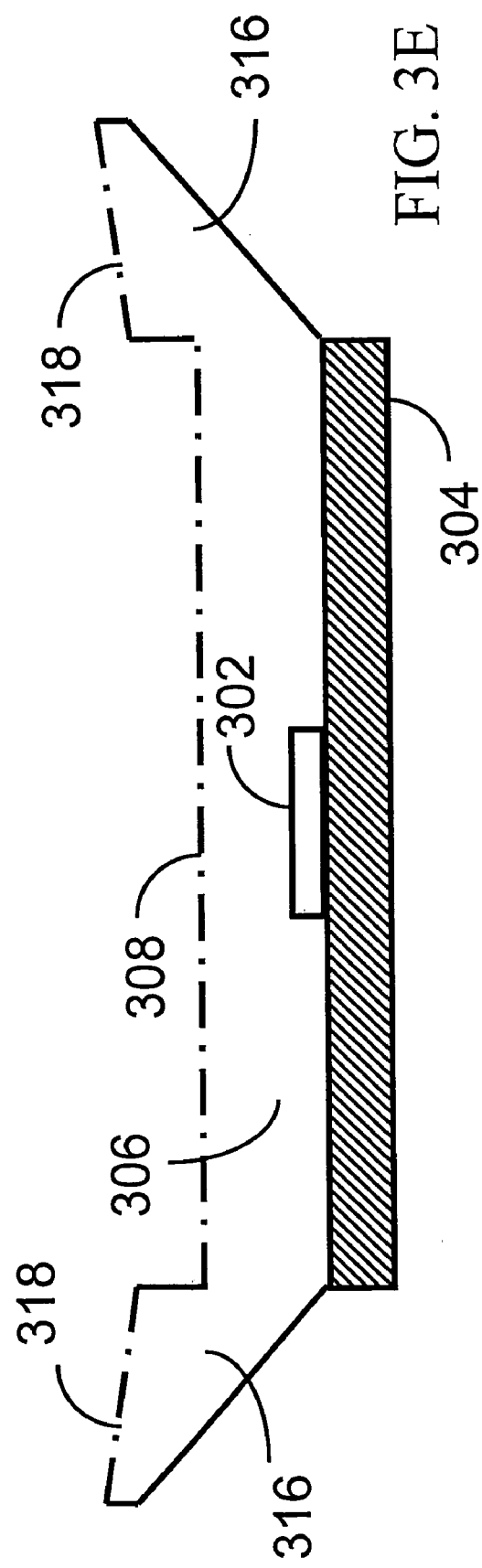

2D/3D DATA PROJECTOR

CROSS-REFERENCE TO RELATED APPLICATION

This application is a continuation of now-allowed U.S. patent application Ser. No. 10/622,296, entitled identical to this application and which was filed on Jul. 17, 2003 now U.S. Pat. No. 7,059,728 and which further claimed priority to Finland Pat. Application No. 20030583 filed on Apr. 16, 2003. This application claims priority to the two applications above, each of which is hereby incorporated by reference.

TECHNICAL FIELD

The invention relates to devices for displaying images by projection.

BACKGROUND

The current trend of mobility drives the consumer demand towards ever smaller portable devices, such as mobile phones, portable digital assistants, music and video players, laptop PCs, head mounted displays etc. As the size becomes smaller and the functionality higher, there is a fundamental problem of showing large enough visual images with very small devices. Because the size of a fixed screen cannot grow without increasing the size of the device itself, the only reasonable way to conveniently provide visual images from small devices is to project them using a data projector. However, the current data projectors are large in size and inefficient in nature.

The commercially available data projectors use high intensity broadband light sources, such as incandescent bulbs or arc lamps. These light sources have inherently low efficiency and produce heat, which consumes high amounts of energy and requires a cooling system. The use of LED as a light source of data projector has also been proposed. However, these solutions do not have well enough optical efficiency. In these systems, the light source has poor external efficiency, and in addition to that, a large part of the light is lost in collimation. Secondly, these solutions are still large in size and expensive with high power consumption, and they cannot be operated with widely used battery technologies.

Another issue that is of interest to large audiences in image projection is the issue of 3-dimensional (3D) projection. The current data projectors are not inherently capable of showing full color 3D images and the special devices that are designed to do so are expensive and rare. The media industry increases the offering on 3D movies, games and other entertainment only if 3D capable devices are commonly used.

SUMMARY OF THE INVENTION

An object of the invention is to provide an improved data projector that is small, inexpensive and has small power consumption and is capable of projecting both 2-dimensional (2D) and 3D images. According to an aspect of the invention, there is provided a data projector, the data projector comprising: at least one micro display having an image to be projected, at least one source unit comprising at least one light source chip, and at least one beam forming component, each beam forming component comprising at least one diffractive element, and each source unit being designed to preserve etendue as far as possible, to minimize photon loss, to provide a desired projection shape and a uniform illumination onto the micro display, and a focusing optical unit for projecting the image of the micro display on a target.

Preferred embodiments of the invention are described in the dependent claims.

The method and system of the invention provide several advantages. The data projector has good power efficiency and the image of the projector has even brightness. The data projector can be made small in size, low in weight and durable. The data projector is capable of showing both 2D and 3D images between which the user may switch freely.

LIST OF DRAWINGS

Figure 2A:
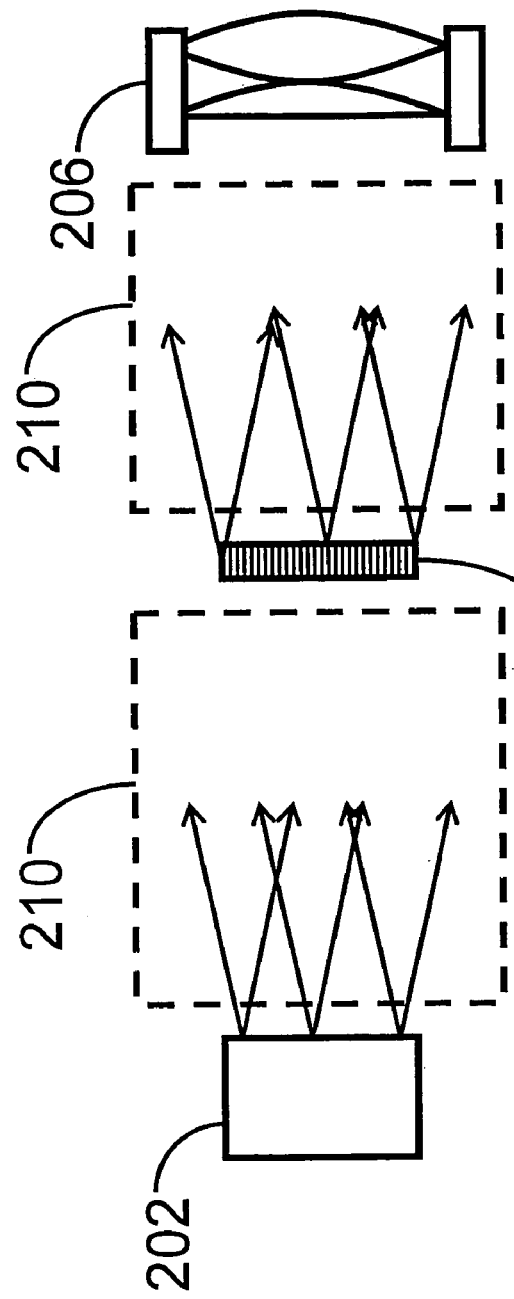
Figure 2B:
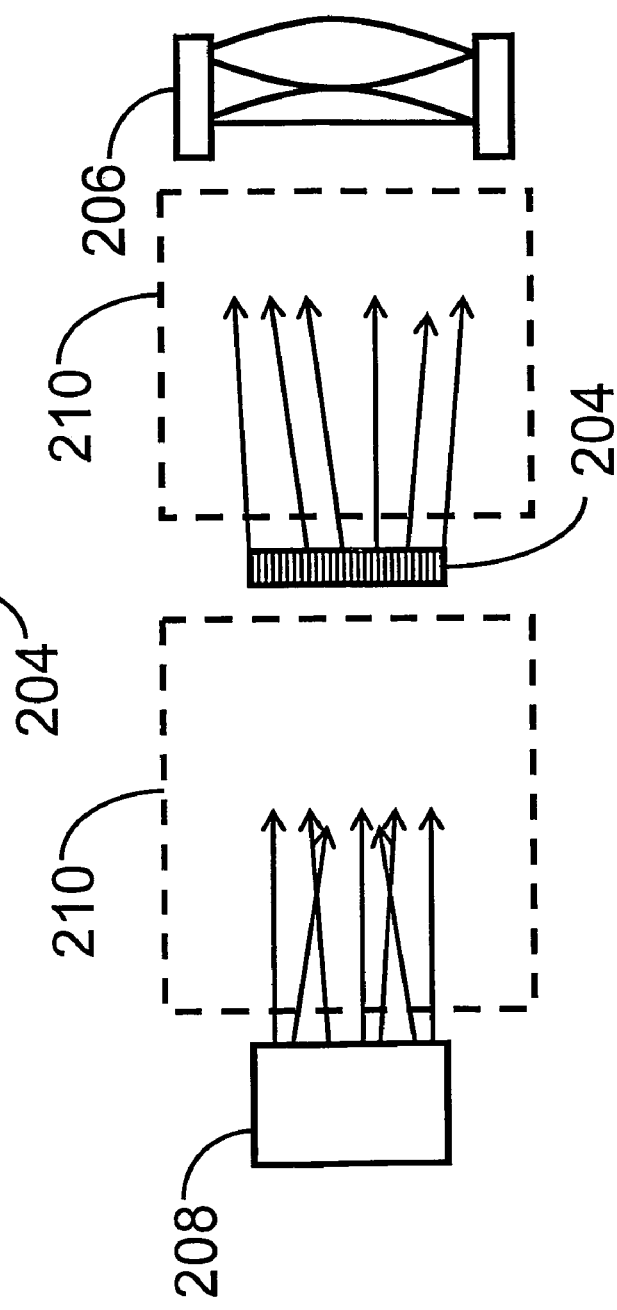
Figure 3F:
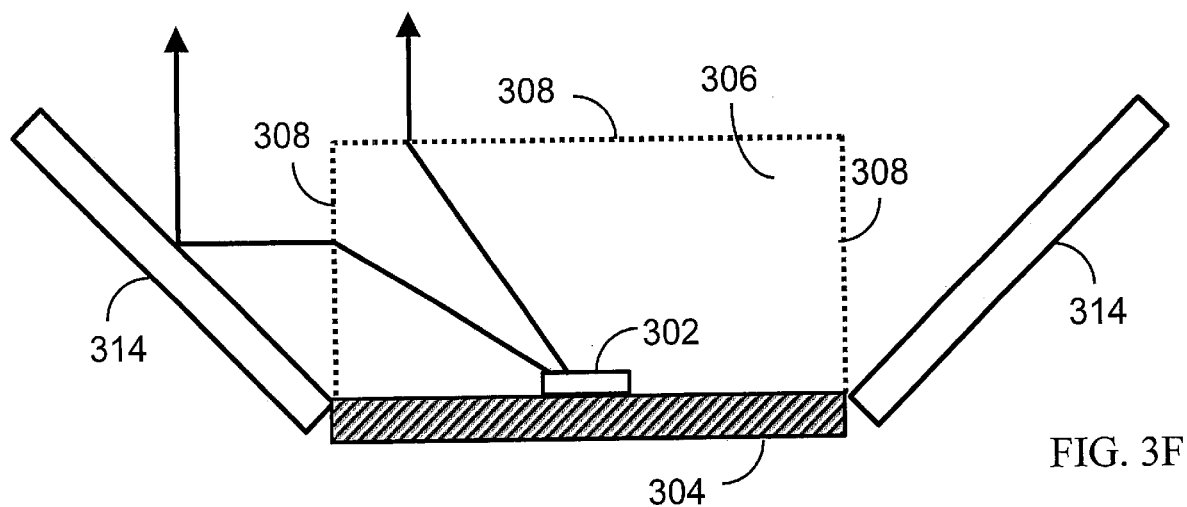
Figure 4B:
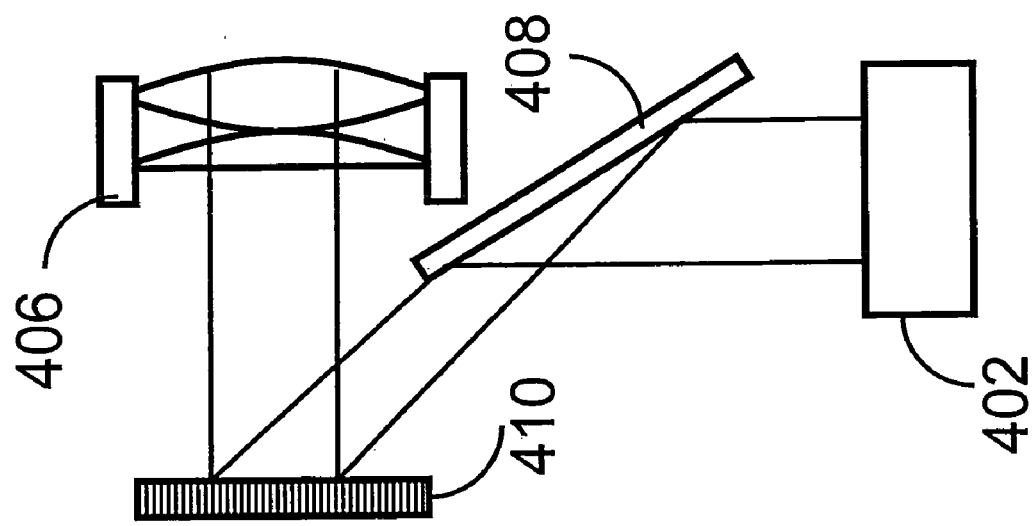
Figure 4A:
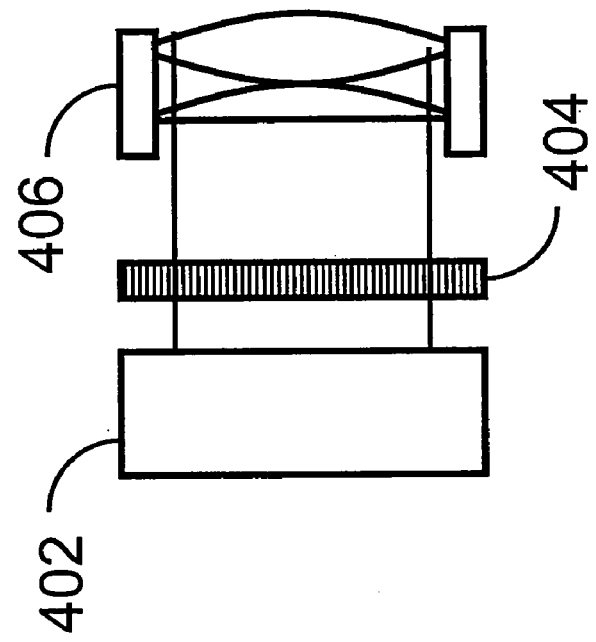
Figure 4C:
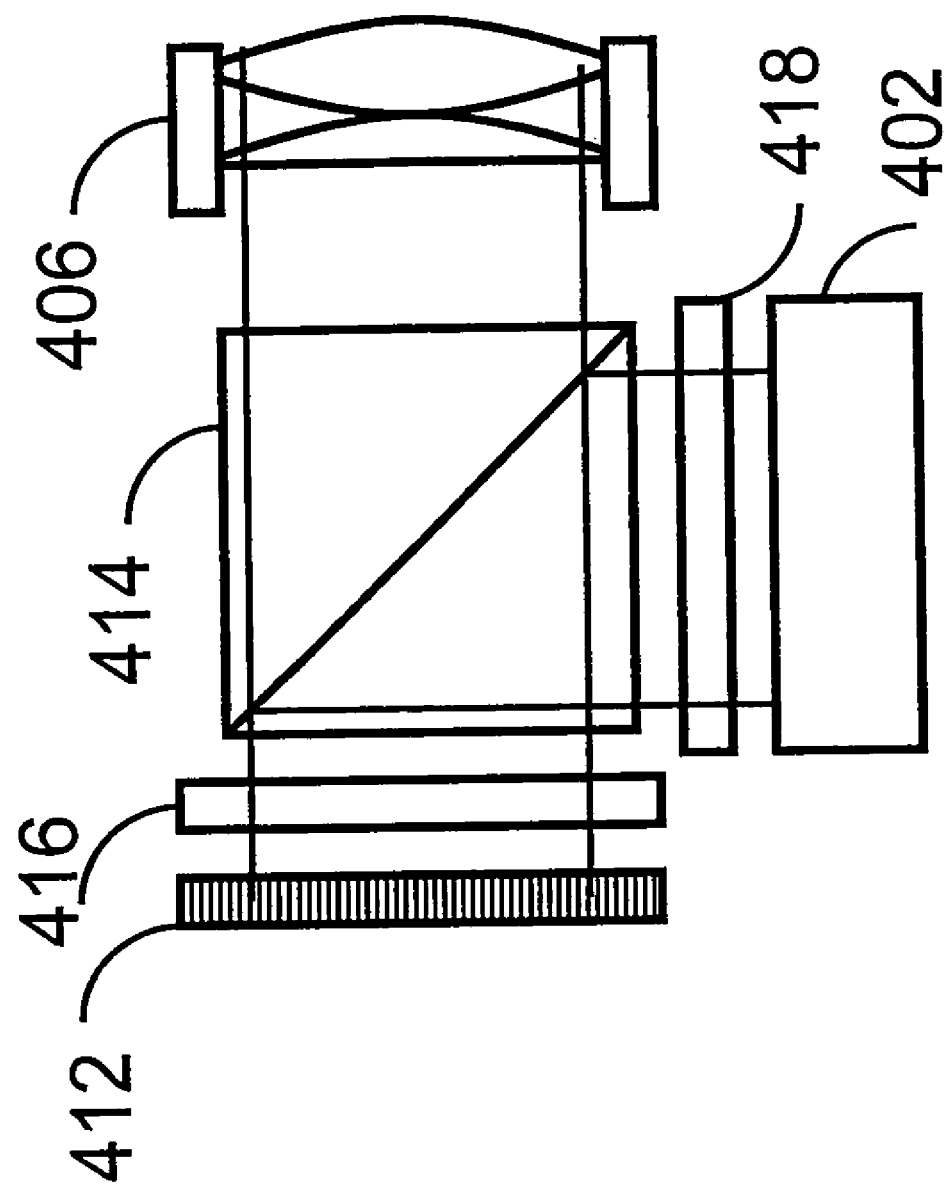
Figure 5:
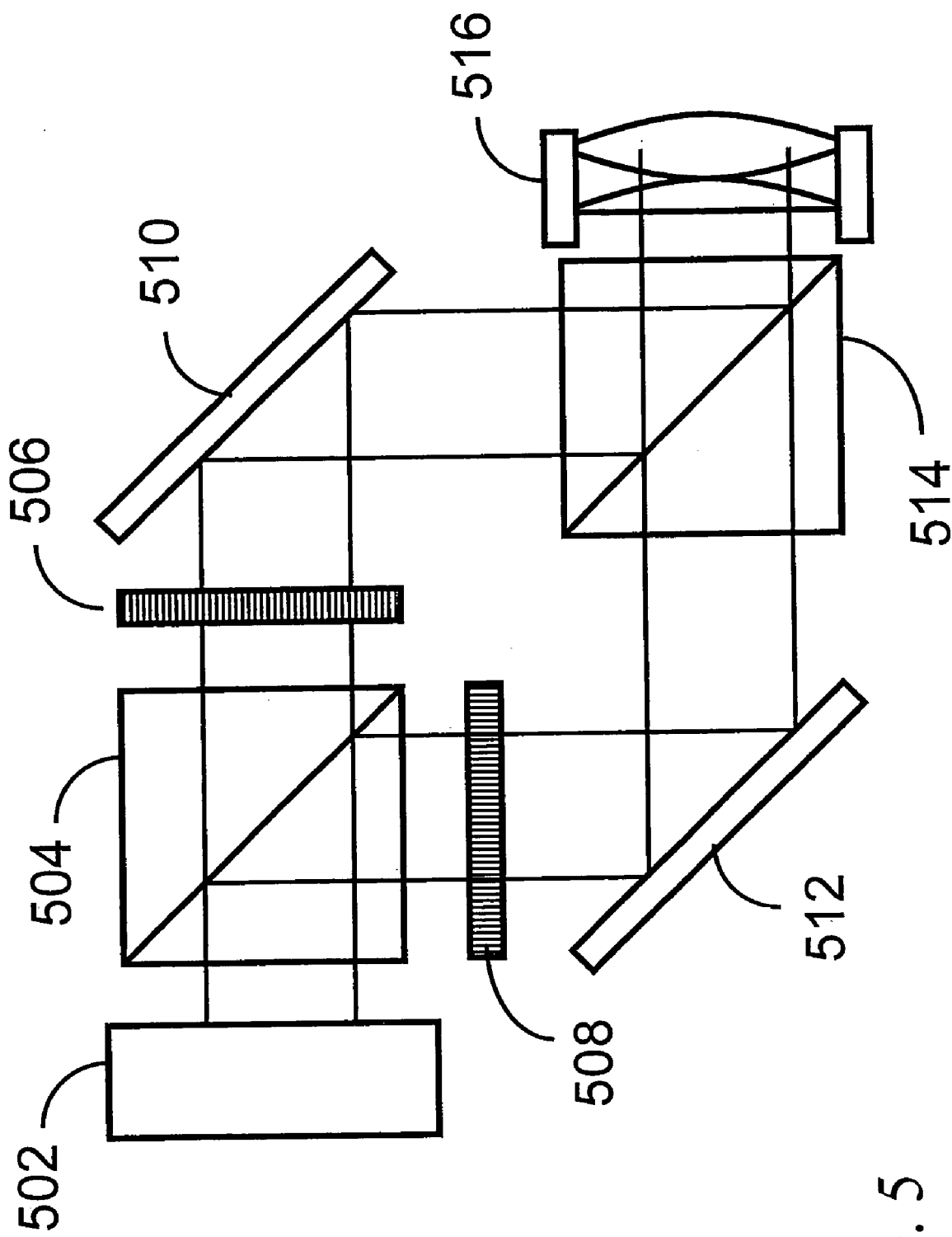
Figure 6:
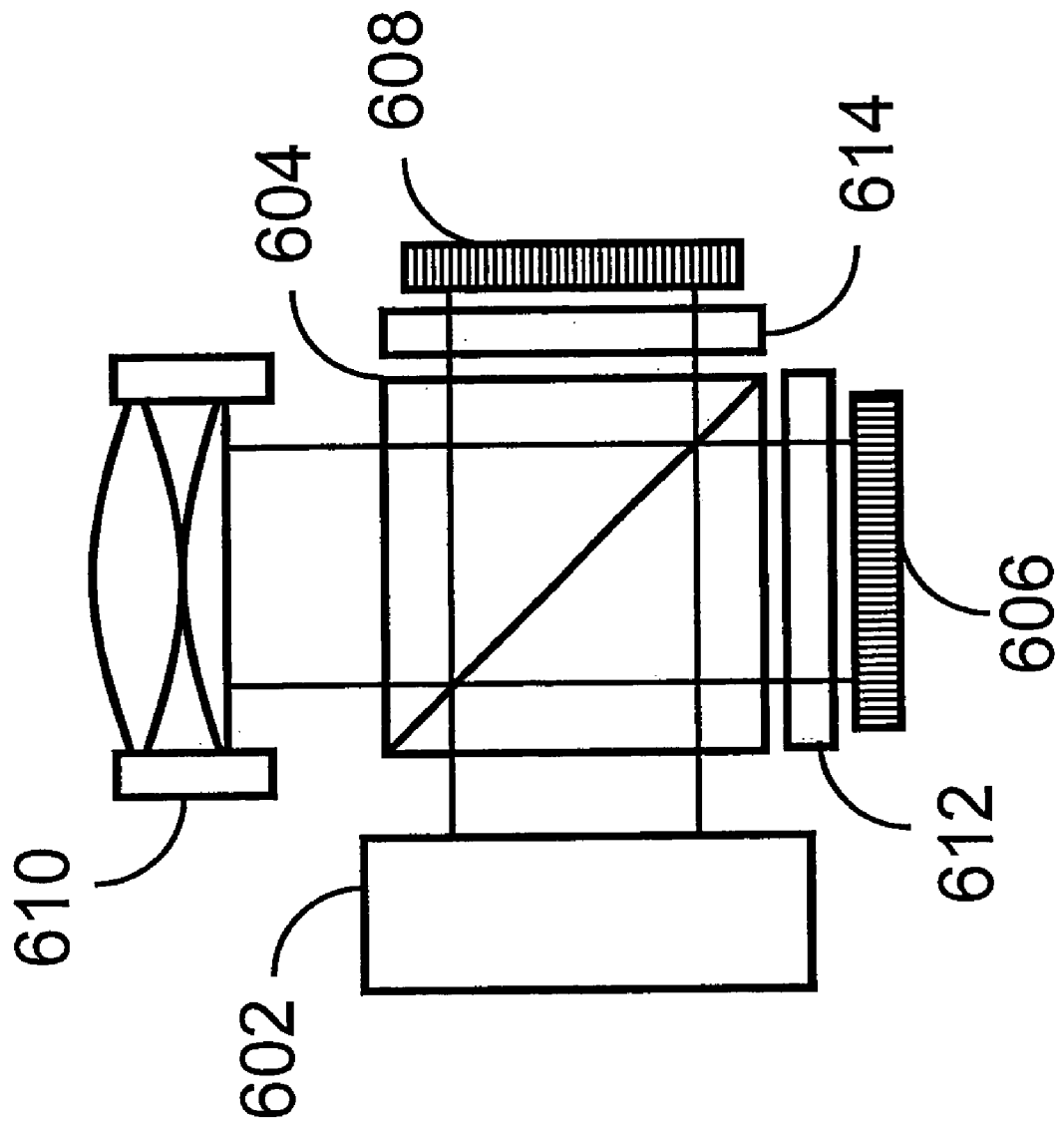
Figure 7:
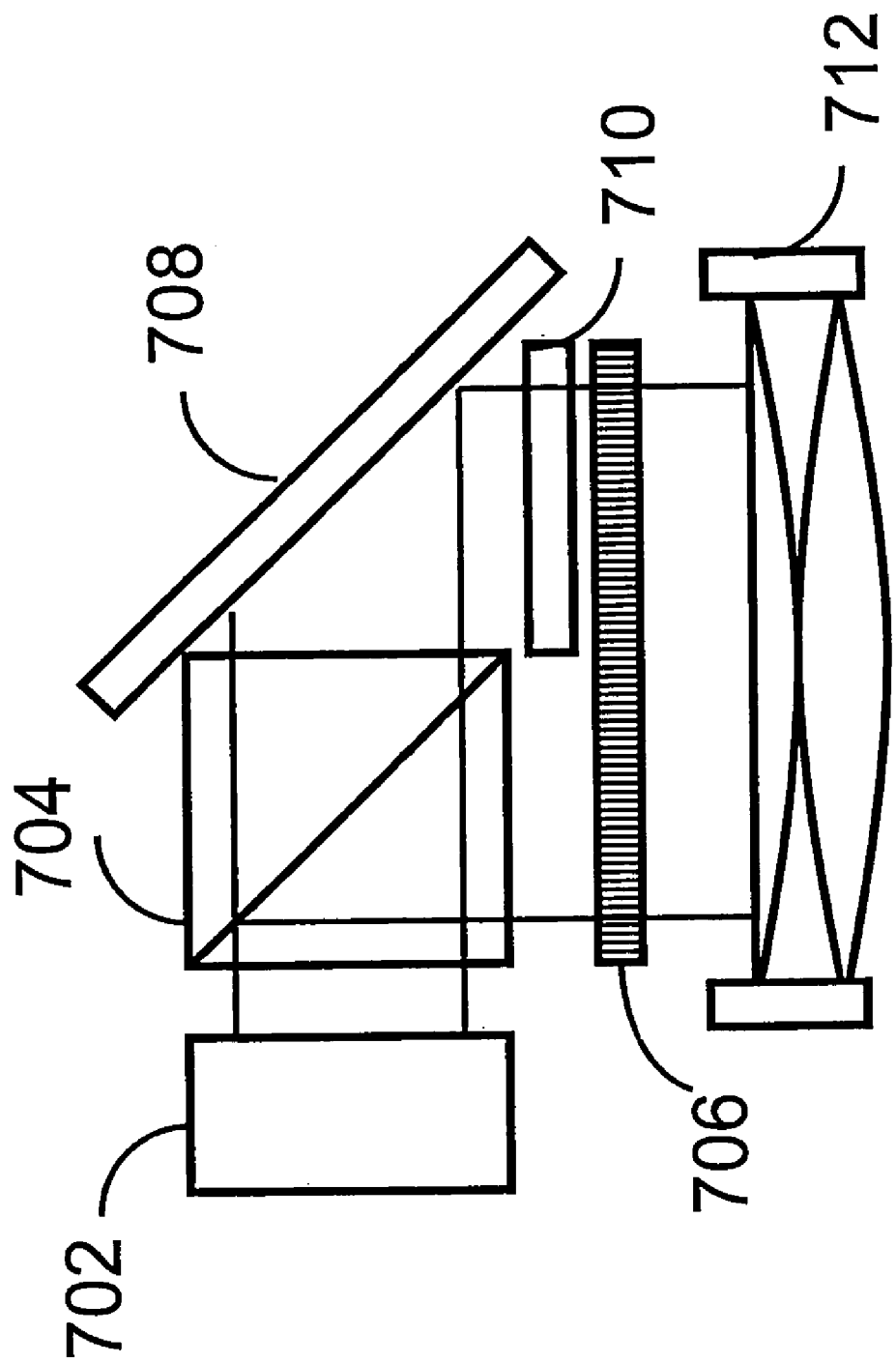
Figure 8:
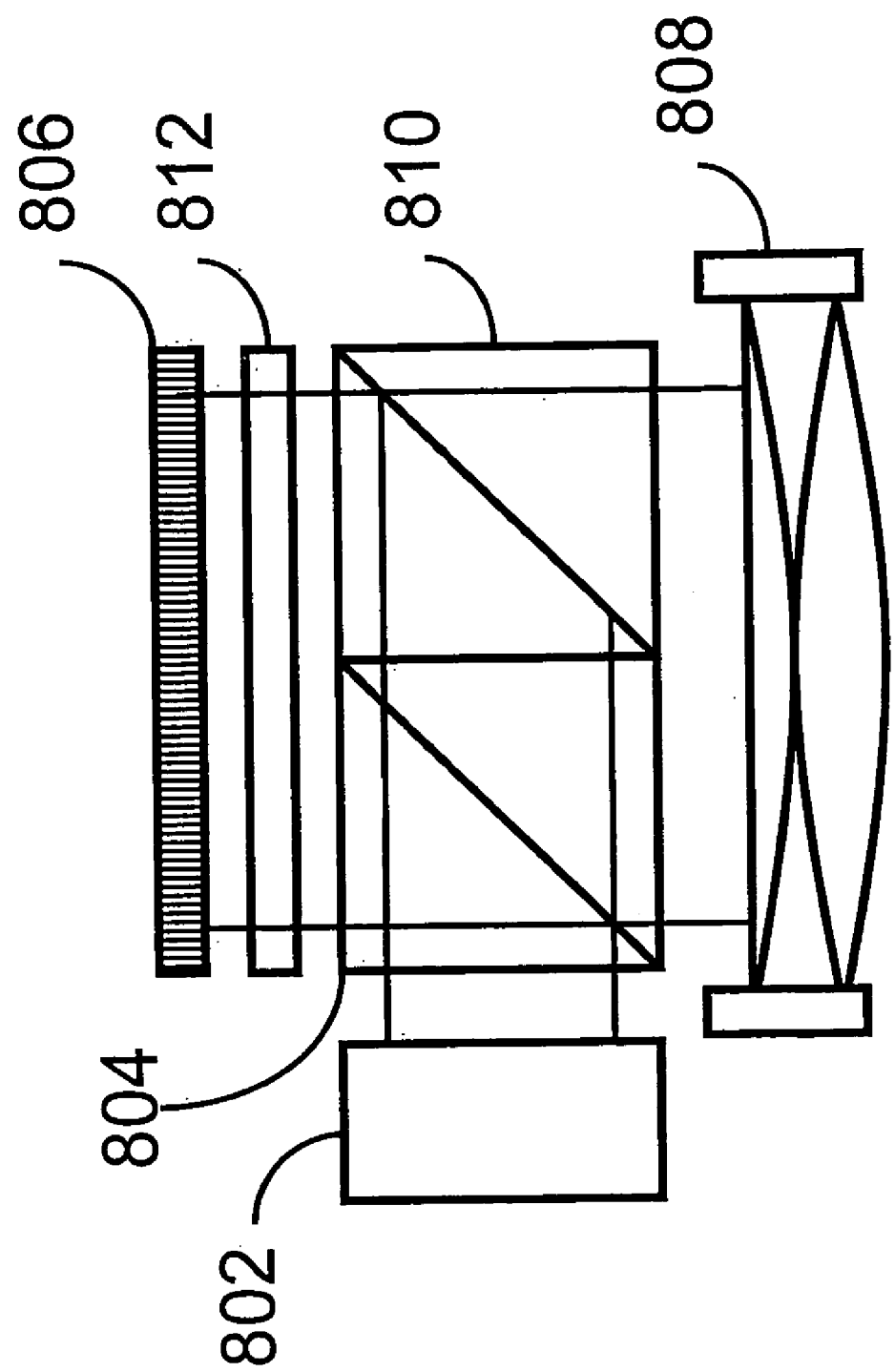
Figures 9A, 9B:
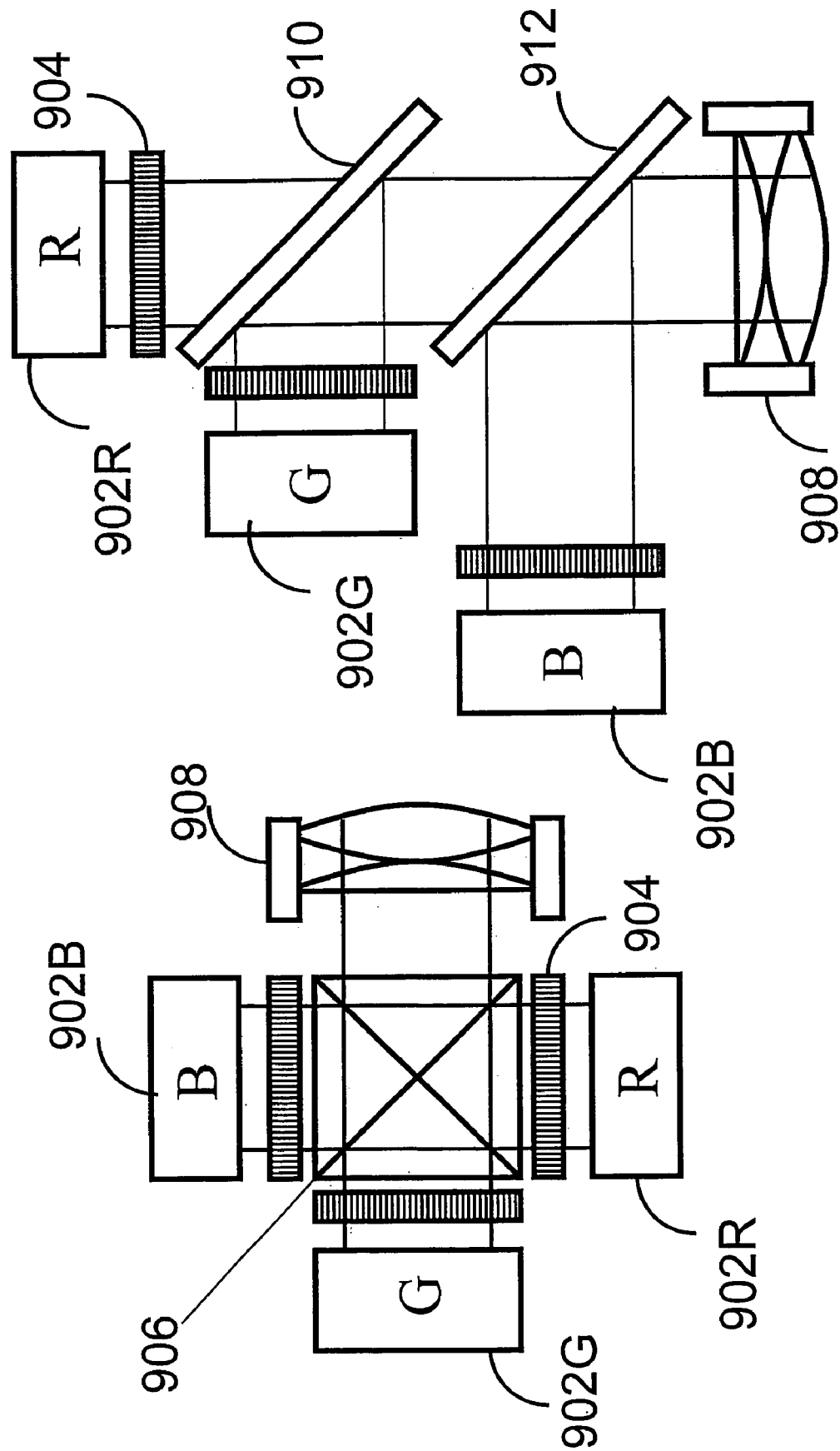
Figure 10B:
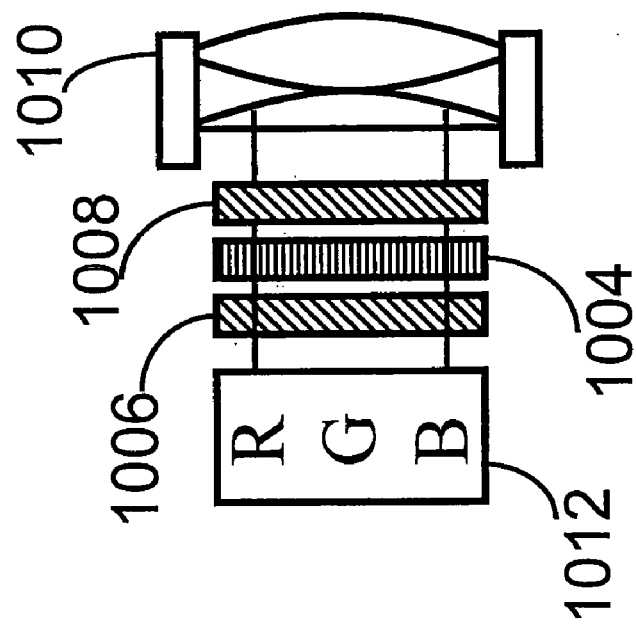
Figure 10A:
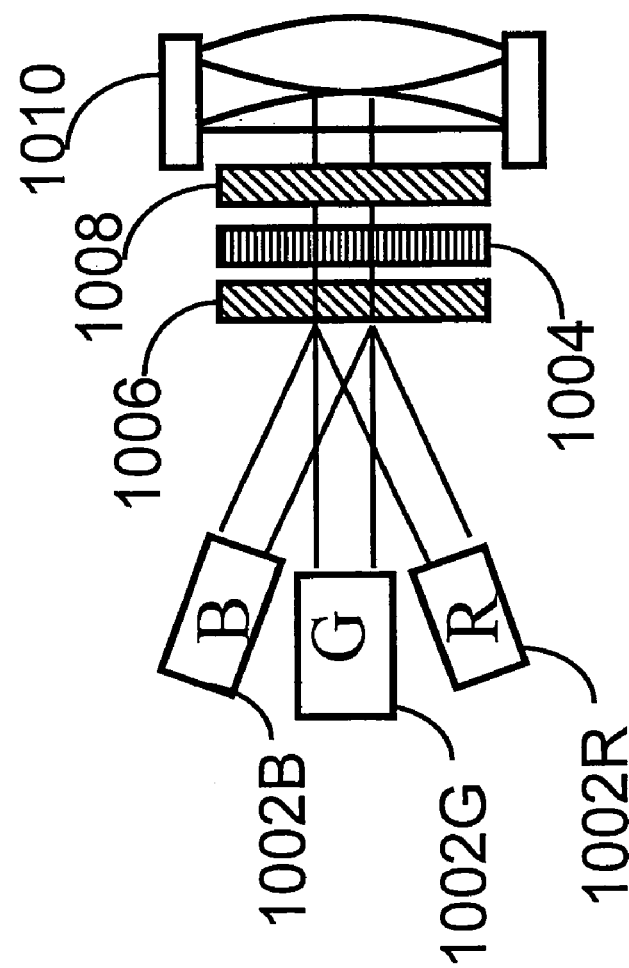
Figure 11:
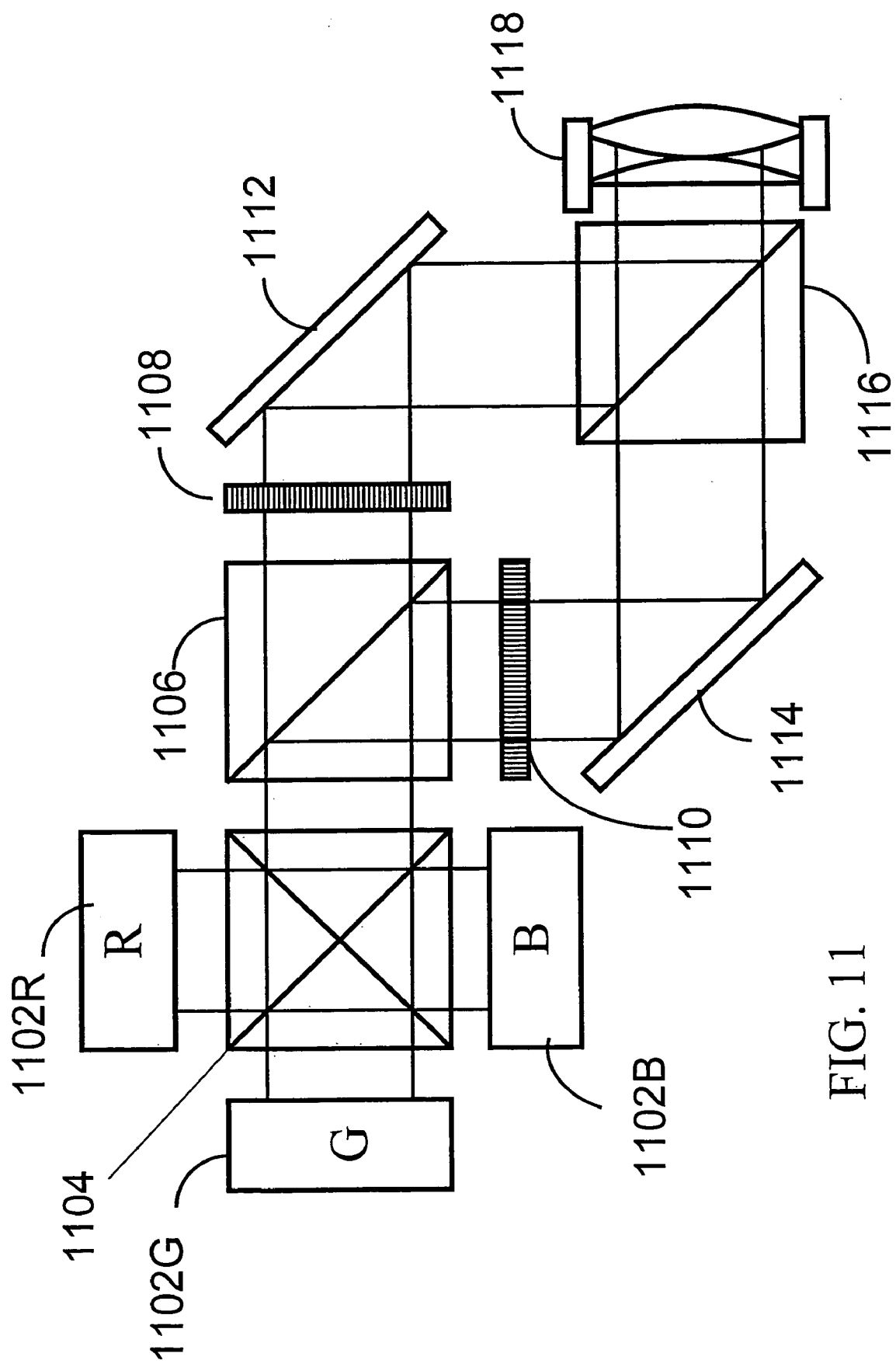
Figure 12:
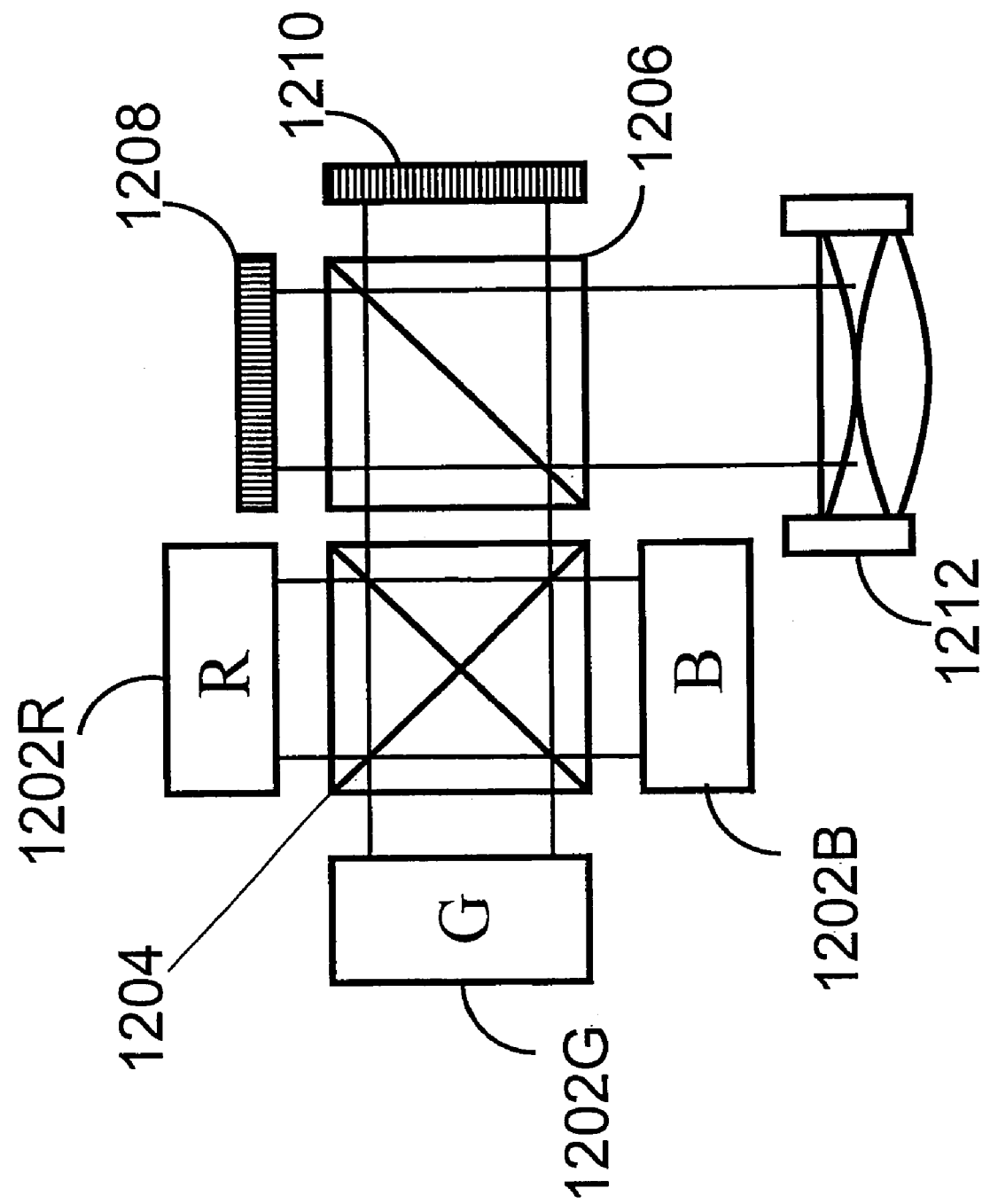
Figure 13:
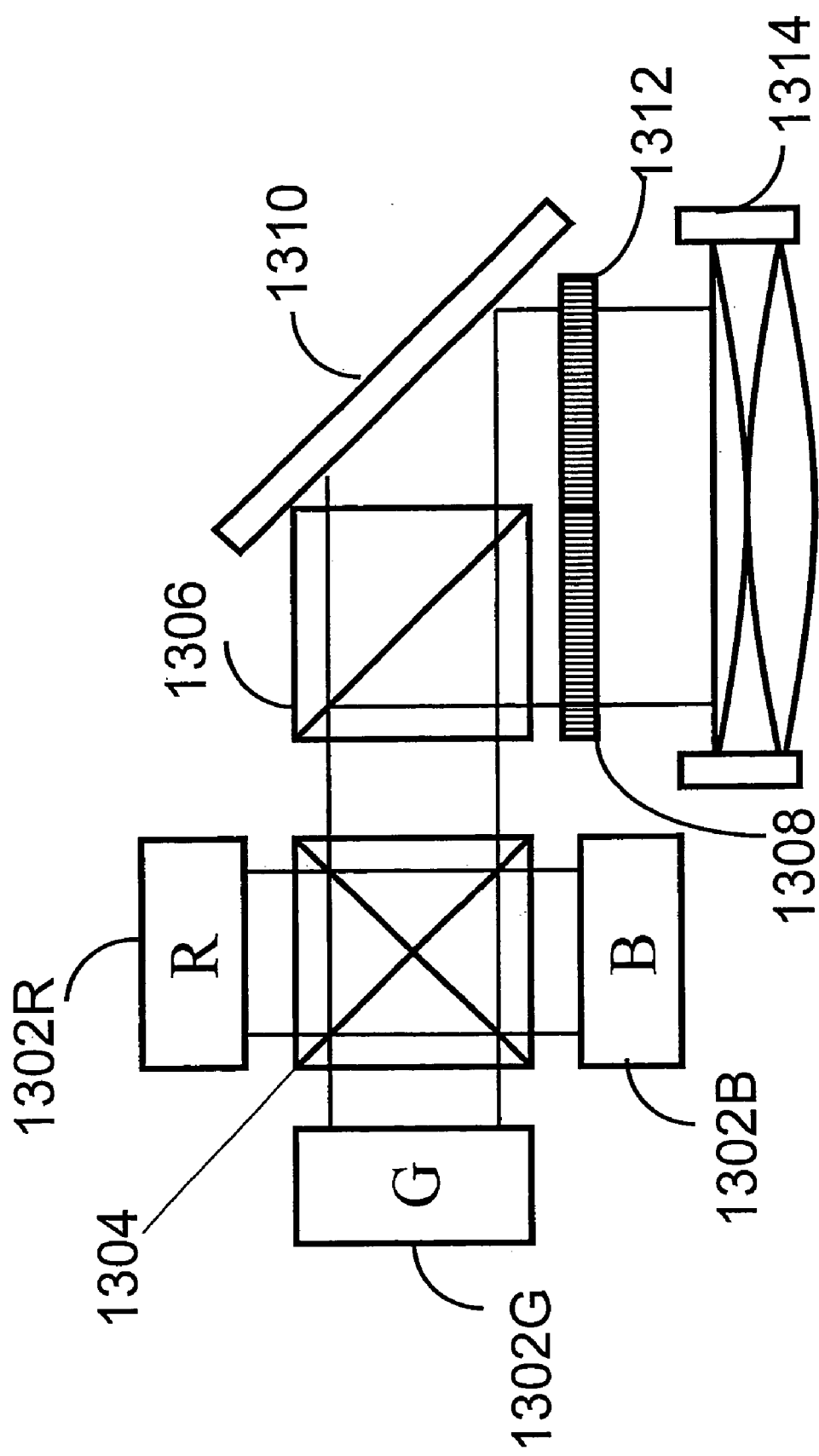
Figure 14A:
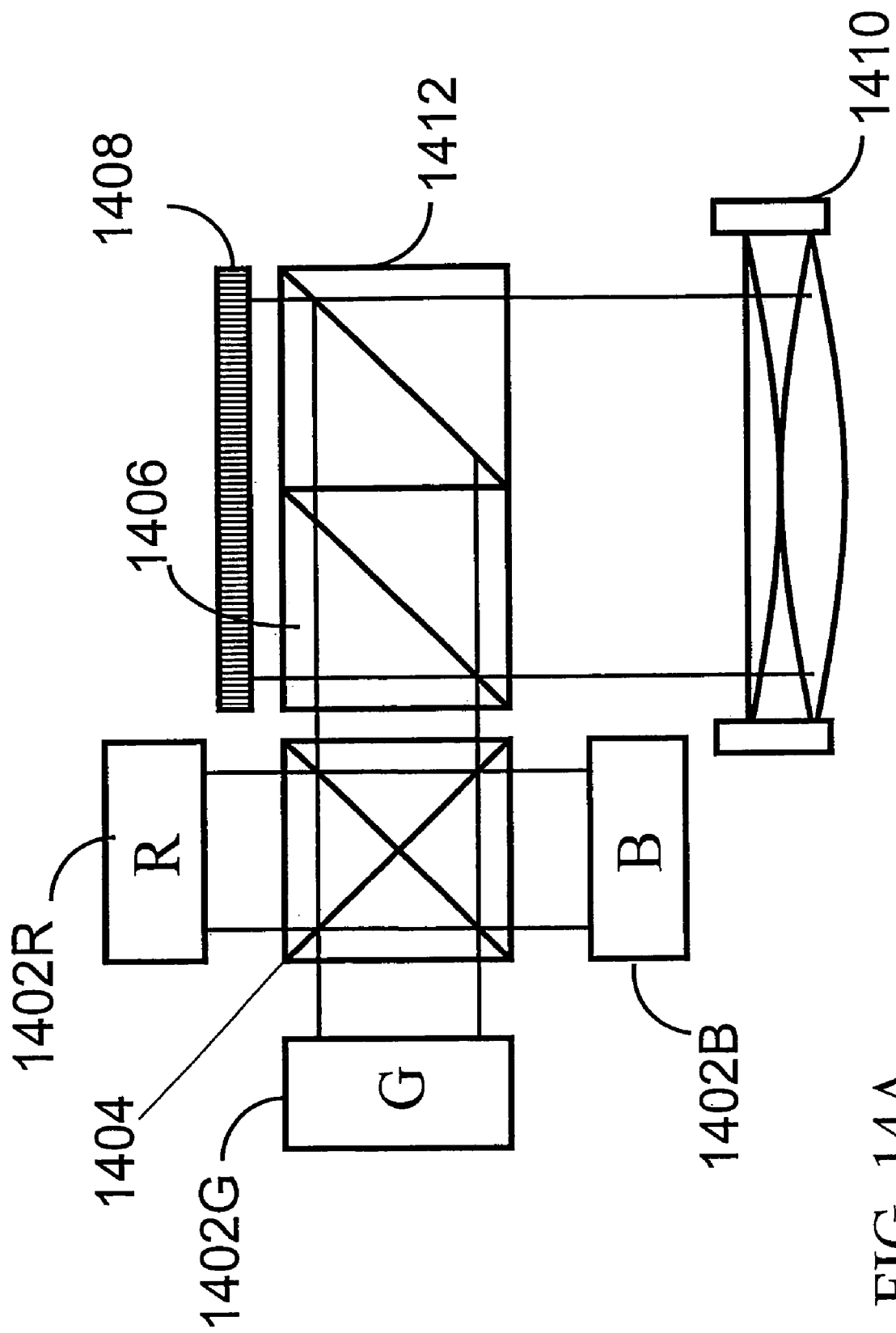
Figure 14B:
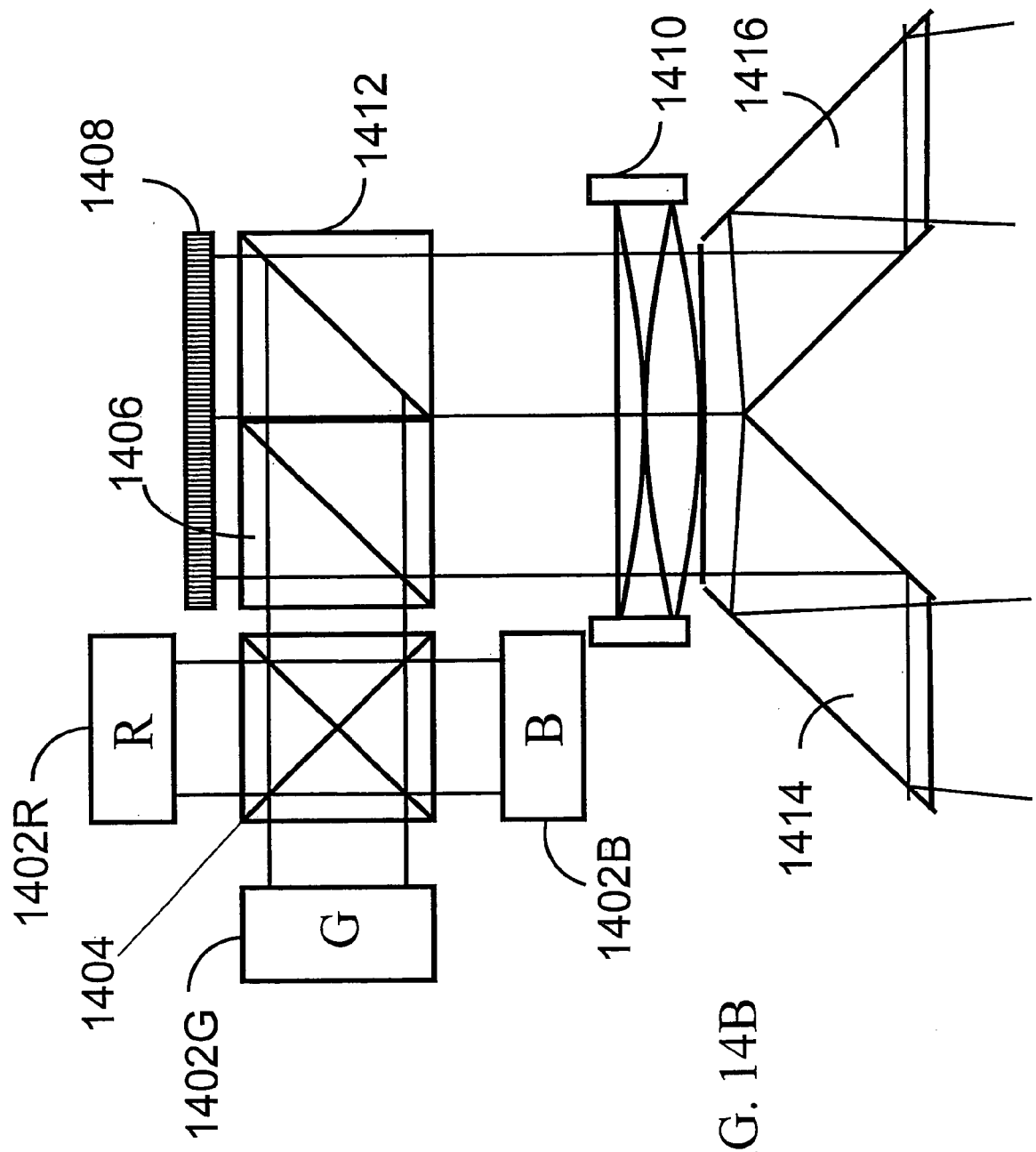
Figure 14C:
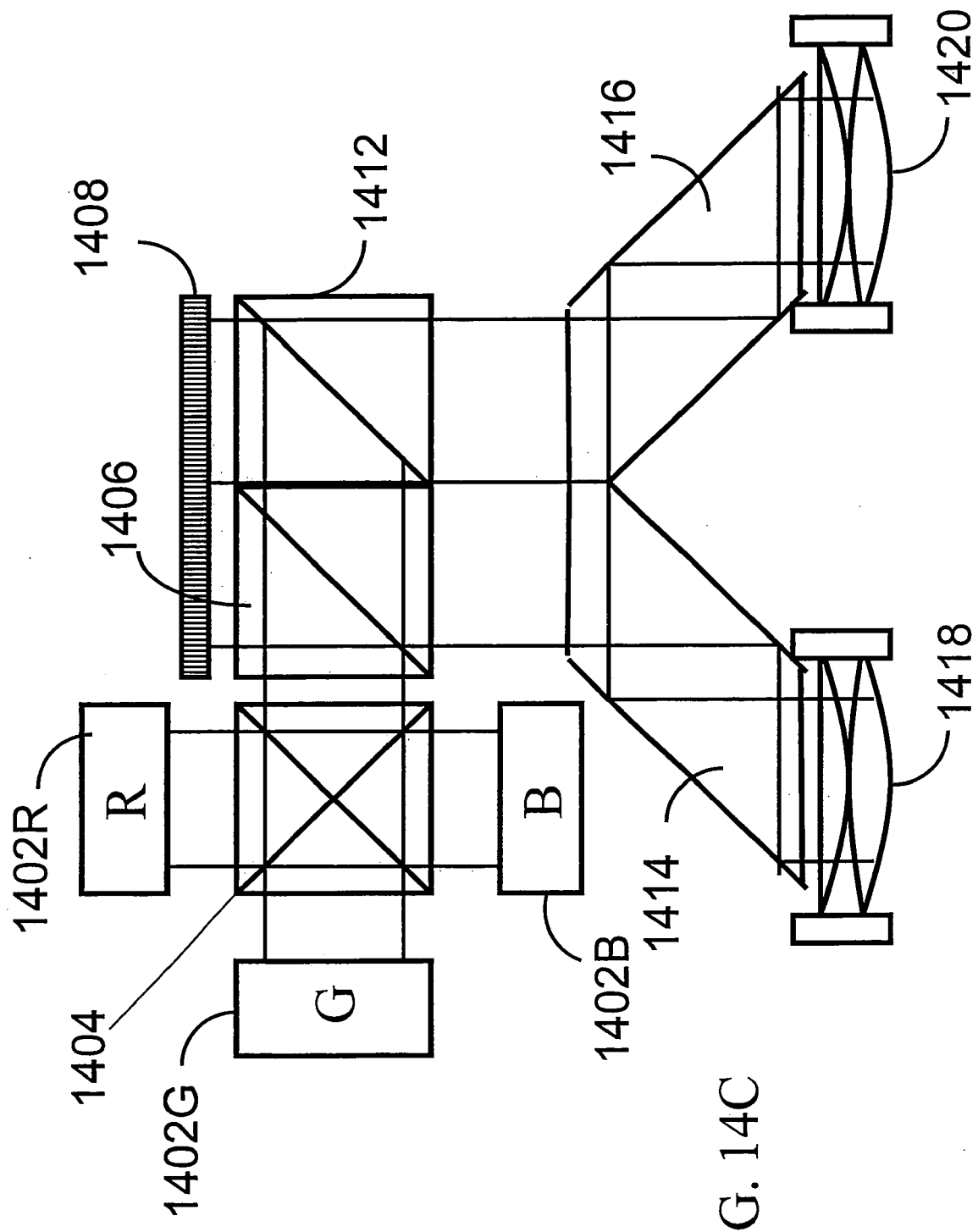
Figure 15:
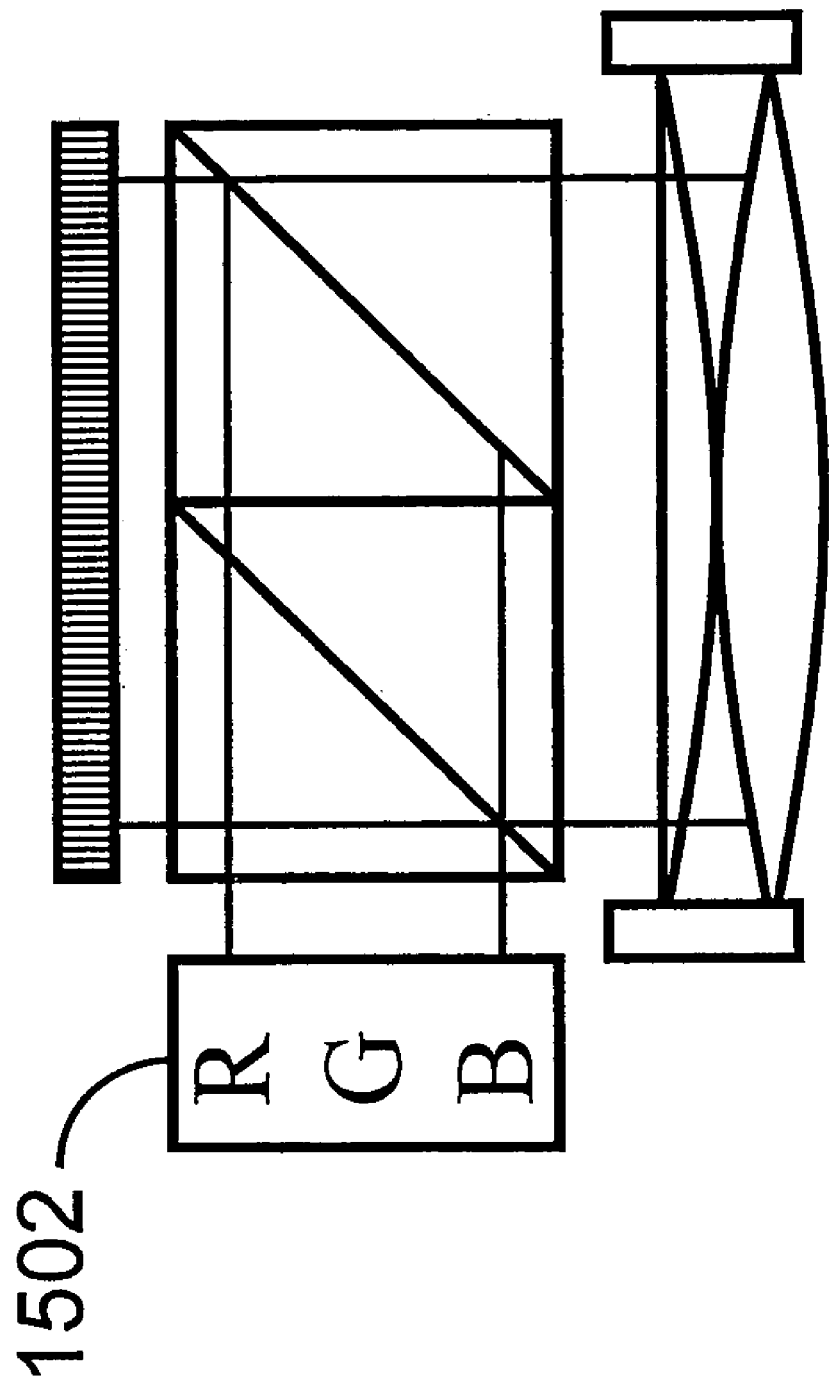
Figure 16:
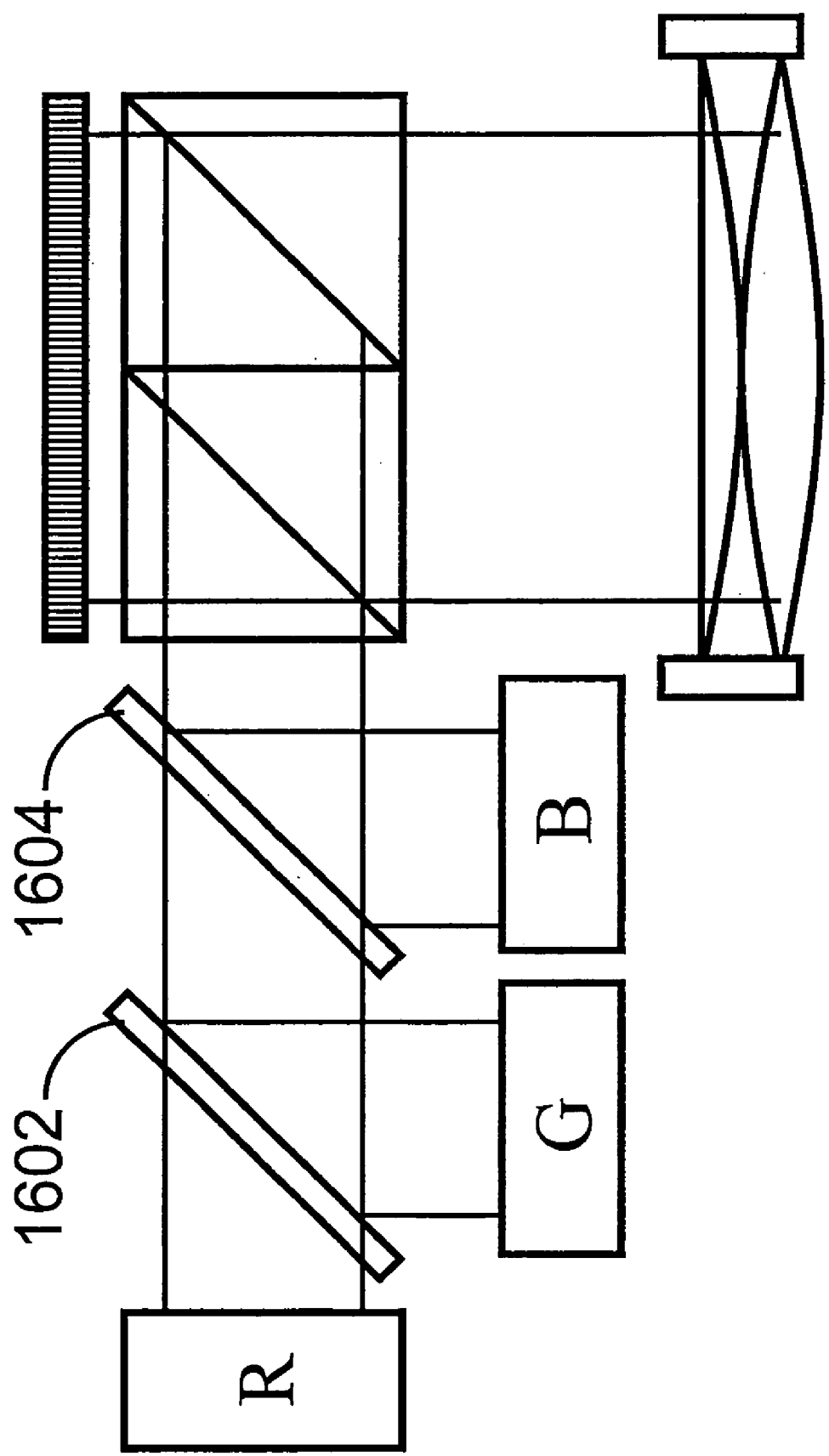
Figure 17:
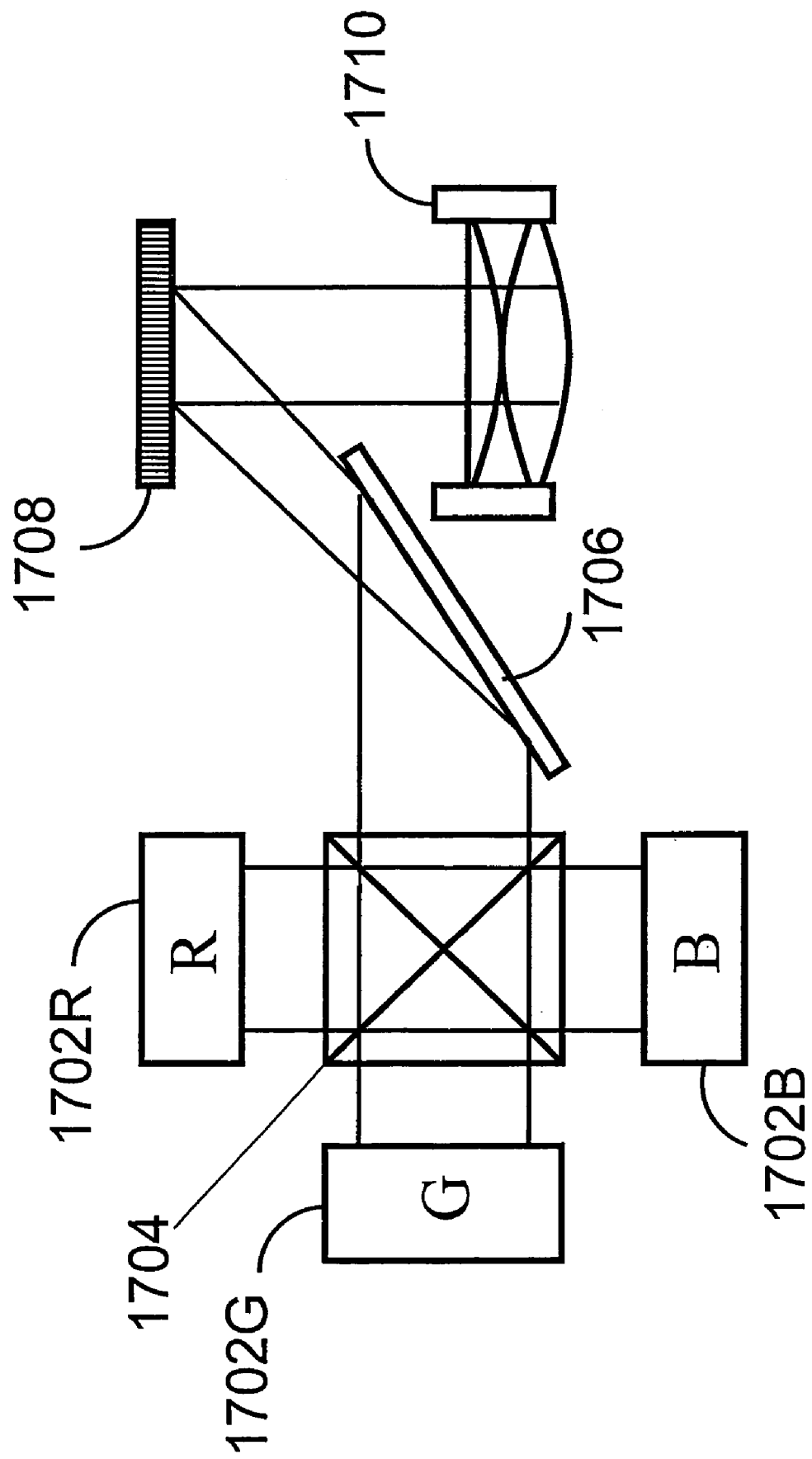
Figure 18:
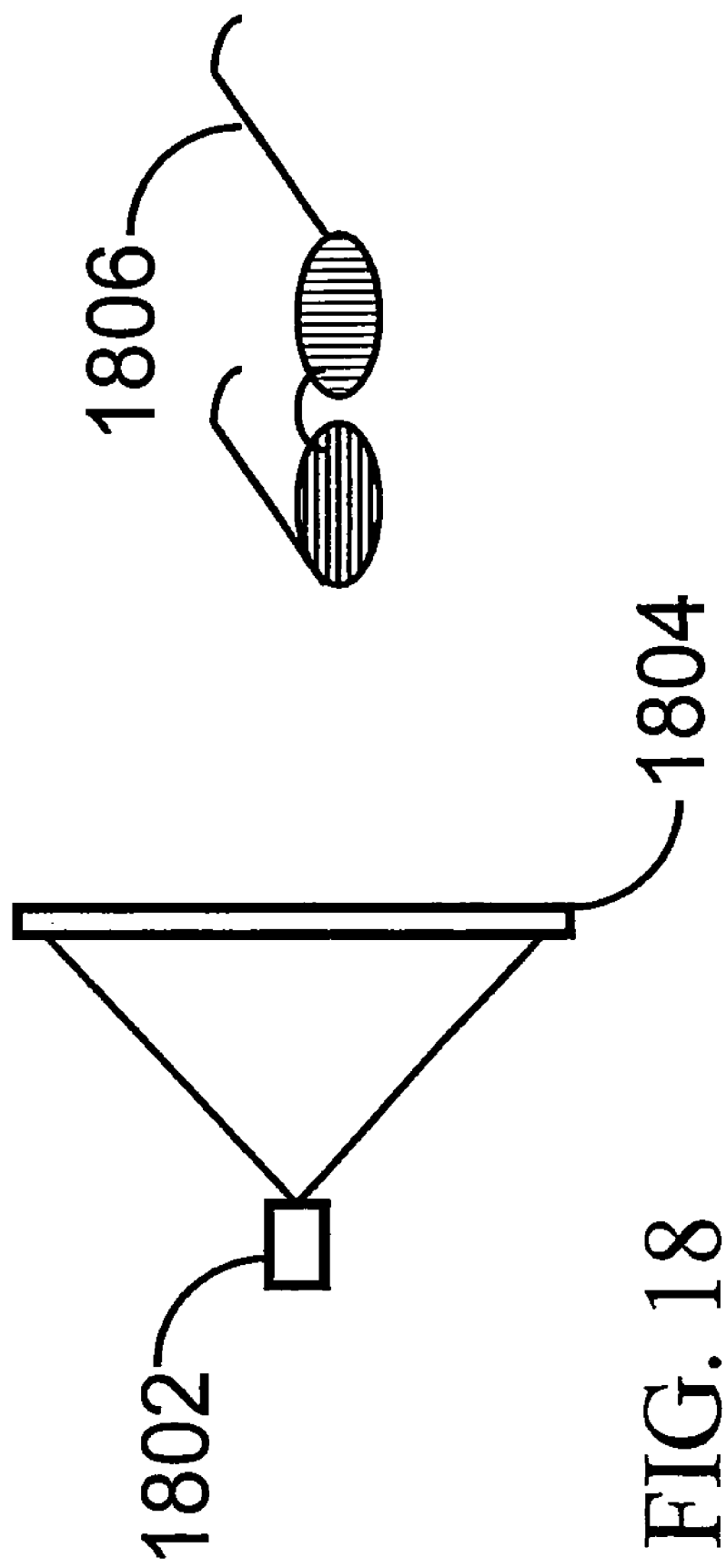

In the following, the invention will be described in greater detail with reference to the preferred embodiments and the accompanying drawings, in which FIG. 1A shows the micro display illumination with a conventional optical arrangement, FIG. 1B shows the micro display illumination with the optical arrangement of the present invention, FIG. 2A shows the beam divergence with a conventional optical arrangement, FIG. 2B shows the beam divergence with the optical arrangement of the present invention, FIG. 3A illustrates a beam forming component integrated with a light source, FIG. 3B illustrates ray traces when a beam forming component is not used, FIG. 3C illustrates a cross section of a beam forming component integrated with a light source, FIG. 3D illustrates a cross section of a beam forming component integrated with a light source, FIG. 3E illustrates a cross section of a beam forming component integrated with a light source, FIG. 3F illustrates a cross section of a beam forming component integrated with a light source, FIG. 4A presents a single color projector with a transmissive LCD micro display, FIG. 4B presents a single color projector with a reflective DMD micro display, FIG. 4C presents a single color projector with a reflective LCoS micro display, FIG. 5 shows a 2D/3D LCD-projector, in which both the polarization states are utilized, FIG. 6 shows a 2D/3D LCoS-projector, in which both the polarization states are utilized, FIG. 7 shows a LCD-projector, in which both the polarization states are utilized, FIG. 8 shows a LCoS-projector, in which both the polarization states are utilized, FIG. 9A shows a color projector with an X-cube beam combiner, FIG. 9B shows a color projector with a dichroic mirror beam combiner, FIG. 10A shows a color projector with a beam guiding component and three source units, FIG. 10B shows a color projector with a beam guiding component and one source unit, FIG. 11 shows a 2D/3D color projector with X-cube beam combiner and LCD micro displays, in which both the polarization states are utilized, FIG. 12 shows a 2D/3D color projector with X-cube beam combiner and LCoS micro display, in which both the polarization states are utilized, FIG. 13 shows a color projector with X-cube beam combiner and LCD micro displays, in which both the polarization states are utilized, FIG. 14A shows a color projector with X-cube beam combiner and LCoS micro display, in which both the polarization states are utilized, FIG. 14B shows a 2D/3D color projector with X-cube beam combiner and LCoS micro display, in which both the polarization states are utilized, FIG. 14C shows a 2D/3D color projector with X-cube beam combiner and LCoS micro display, in which both the polarization states are utilized, FIG. 15 shows a color projector with one source unit and LCoS microdisplay, in which both the polarization states are utilized, FIG. 16 shows a color projector with dichroic mirror beam combiner and LCoS micro display, in which both the polarization states are utilized, FIG. 17 presents an embodiment of the color projector where serial illumination is used;

FIG. 18 shows a 3D color projector, in which both the polarization states are utilized so that both states have separate images that are viewed through eyeglasses that have perpendicular polarization filters for each eye.

DETAILED DESCRIPTION OF EMBODIMENTS

The efficiency of the projector is degraded by the losses which include: spectral losses (if wideband sources are used), losses due to poor internal efficiency of the source, losses due to poor external efficiency of the source (for example with LEDs), light collection losses (collimation losses), integration losses (if several light beams are combined), color separation losses (losses in dichroic mirrors used to split the light into red, green and blue components), polarization losses (if LC-micro display is used), reflection or transmission losses at the micro display itself for example due to a poor fill factor (gaps between the pixels), color combination losses (for example when using X-cube or dichroic mirrors), and losses in the projection lens (reflection losses on the lens surfaces).

It is extremely important that the light loss is minimized in every aspect. It is also desirable to be able to maximize the internal and external quantum efficiencies of the light source. The light should only be directed to the active area of the micro display which functions as a spatial modulator. The loss in the optical components and in the micro display should be minimized.

Spectral losses occur when incandescent bulbs or arc lamps are used as a light source. They emit light with a very broad wavelength band and most of the electric power is converted to heat. By using LED (Light Emitting Diode) sources, for example, this problem can be avoided because is it possible to create light only for the needed wavelength bands (red, green and blue).

The total efficiency of LEDs depends on the internal quantum efficiency, and the external efficiency. The definition of internal quantum efficiency is the ratio of the number of electrons flowing in the external circuit to the number of photons produced within the device. The external quantum efficiency means the ratio of the number of photons emitted from the LED to the number of internally generated photons. The internal quantum efficiencies can be near 100%, for example 99%, with certain materials, wavelengths and structure of the LED chip. However, a large fraction of the generated light is never emitted from the semiconductor, but is absorbed into the LED chip itself. This happens because of the big refractive index difference between the LED chip and the surrounding material, which causes that the most of the light is trapped inside the chip by total internal reflection. The external efficiency ratio can be as poor as $1/(4n^2) \approx 1/50$, (where n=3.5 is the refractive index of the semiconductor) for the conventional LEDs. More sophisticated LED designs include features that allow a greater fraction of the internal light to escape. These features include hemispherical or conical semiconductor domes over the LED, surface roughening, transparent substrates and superstrates and photon recycling. Resonant-cavity LEDs use quantum electro dynamical enhancement of spontaneous emission in high-finesse resonators. These methods allow up to 30% external efficiencies, which is still far below the optimum case. Still another proposed method is to cut the semiconductor chip into a truncated inverted pyramid by which 55% external efficiencies have been achieved.

Light collection loss presents, along with the poor external efficiency, one of the most severe light losses in the projector system. Most of the light coming from an LED can be collimated by using a convex lenses or reflectors based on total internal reflection or metallized reflectors. Typically this forms a relatively compact beam which has circular symmetry. However, the circular beam is not ideal because the micro display can have a rectangular shape. Because of this shape difference a big portion of the light is lost. These solutions also suffer from vignetting, i.e. the intensity of light is not even across the micro display. In addition to that, by using existing light collecting and collimation techniques, the collimation of the beam can not be optimized for the whole optical system.

Integration losses, color separation losses and color combination losses are difficult to improve in practice. They can be minimized by choosing dichroic mirrors, X-cubes and beam splitters carefully. When using a LCD or LCoS micro displays, the polarization losses are significant resulting in a loss of over 50%. Typically nothing is done to avoid these losses. The micro displays have internal losses which depend on the micro display type, modulation rate, and reflections and scattering at the micro display itself, for example, due to poor fill factor (gaps between the pixels). When using an LCD micro display, the loss due to poor fill factor is typically between 20%-40%. The losses due to a poor fill factor can be decreased by applying so called micro-lens arrays (MLA) before and optionally also after the liquid crystal panel which guides the light through the active pixel area. LCoS and DMD micro displays have substantially better fill factors than LCD micro displays.

The losses in the projection lens can be minimized by using antireflection coated lenses. This is a question of costs, whether to stand this loss or to use the more expensive lenses.

Source Chips:

A data projector of the invention may comprise one or more narrow band source chips, which work in the visible range. The source chips can comprise of LED, OLED or quantum-well LED chips, for example, or other alike. The bandwidth of each narrow band source chip is narrow in comparison to the whole visible range (400 nm ... 750 nm), for example the bandwidth can vary from a nanometre to more than 150 nanometres, particularly the bandwidth can be from 10 nm to 50 nm. The data projector can be provided with one or more source chips which all emit light with the same wavelength band. In color projectors the source chips provide light with different bands. Typically the source chips may together provide light with red, green and blue.

Source Unit:

The projector of the invention comprises one or more source units. The source unit comprises one or more source chips which are integrated with an innovative beam forming component. The function of the beam forming component is to raise the external efficiency of the source chips, and to provide the out coupled beam with a particularly designed intensity distribution and divergence angles.

The beam forming component provides uniform illumination to the micro display. FIG. 1A shows an illuminating beam 106 on the micro display 104 when a light source 102, such as LED, is used with conventional optical arrangements (not shown in FIG. 1). As it is seen, a substantial part of the light 106 does not hit the micro display 104. In addition, the illumination is not uniform and suffers from vignetting (shown using different hatchings).

FIG. 1B in its part shows an illuminating beam 110 on the micro display 104 when the source unit 108 of the present invention is used. The shape of the beam 110 is nearly rectangular so that it suitably fills the micro display 104. In addition to that, the micro display is illuminated uniformly so that vignetting is minimized.

For considerations of light loss in an optical system, the most important parameter is the etendue. For a surface of arbitrary shape, the etendue in its general form is defined as (light coming from material with a refractive index $n_1$)

$$E = \frac{n_1^2}{n_2^2} \int\int dA \hat{e}_A \cdot d\Omega \hat{e}_\Omega,$$

where $n_1$ and $n_2$ are the refractive indices of the materials, dA is the differential area element on the surface, $\hat{e}_A$ is the surface normal vector corresponding to dA, $d\Omega$ is the differential solid angle element, and $\hat{e}_\Omega$ is the centroid direction vector corresponding to $d\Omega$.

Conservation of etendue through the whole optical system means that the optical system is lossless. Moreover, the etendue cannot be decreased by any optical configuration. Therefore, it is crucial to design the optical system so that the etendue is increased in a particular component as little as possible.

The total flux passing through a surface can be calculated as follows:

$$\phi = \frac{n_1^2}{n_2^2} \int\int L(\hat{r}, \hat{e}_\Omega) dA \hat{e}_A \cdot d\Omega \hat{e}_\Omega,$$

where $L(\hat{r}, \hat{e}_\Omega)$ is the luminance of the surface in position $\hat{r}$, to direction $\hat{e}_\Omega$.

In the small portable projector applications the smallest micro displays has to be used in order to get the projector small enough. This constraint typically leads to micro displays whose diagonals range from 0.5 cm to 1.5 cm. The etendue of these small micro displays are relatively near to the original etendue of the LED chip itself. The commercially available light collection and collimation structures for LED chips do not preserve the etendue of the original LED chip well enough and a substantial amount of light is lost so that it does not hit the micro display, and in addition to that the remaining light may have too wide opening angle. Too wide opening angle causes loss of light because part of the light propagates out of the optics area, and also the losses in LCD, LCoS, polarization beam splitters, filters etc. increase with the increasing opening angle. The contrast ratio also decreases when opening angle increases in many projector configurations.

FIGS. 2A and 2B illustrate the affect of the carefully designed distribution of the divergence angle of the beam. FIG. 2A shows a typical situation with the existing light collimation structures. The most efficient projector configurations demand some optical components 210 between the source unit 202 and the microdisplay 204 and/or also between the micro display 204 and the focusing objective 206. As it can be seen in FIG. 2A the beam divergence causes substantial losses which can not be avoided if the size of the micro display and/or the size of the objective and other optical components are not increased.

FIG. 2B presents the situation with the source unit 208 of the invention. The etendue of the source chip is preserved substantially better. In addition to that, the divergence angle distribution is designed so that the loss is minimized at the whole length of the projector. The transmission losses in the micro display 204, polarization components, X-cubes, dichroic mirrors, lenses, diffractive elements etc. decrease when the opening angle of the beam decreases. One major benefit of the innovation is that the opening angle of the beam is minimized that leads to smaller losses in the other optical components than with the conventional solutions.

The source unit of the present invention is close to an ideal etendue and total flux preserving component that deforms the intensity and angle distribution of the input beam so as to meet the requirements for the micro display, but at the same time, so as to minimize the total beam divergence. The main design principle is that the special requirements for individual components are met as well as possible, but the etendue preserved as far as possible. The optimization parameters include the area, light intensity distribution, angle, and beam divergence at every position of the projector. The principal figure of merit is the ratio "flux out of projector divided by the electrical power consumed by the optical sources". There are also secondary criteria, such as illumination uniformity and contrast. The preceding equations allow plenty of optimization possibilities in design.

The source unit of the invention comprises one or more source chips which are integrated with a beam forming component. One embodiment of the source unit comprises one source chip integrated with a beam forming component. Another embodiment of the source unit comprises several source chips, each providing light with the same wavelength band, and each integrated with a beam forming component of its own. The beam forming components are designed so that the beams together form the desired beam. These source subunits can be integrated into a single unit so that they comprise a single unit, which may be beneficial in certain device assemblies. The combined beam forming components can further have a common beam forming component which improves the performance of the whole unit.

Still another embodiment of the source unit comprises more than one narrow band sources, some or each of which are working with a different narrow wavelength band. Typically the source unit comprises red, green and blue LEDs, for example. Each source is integrated with a beam forming component. The beam forming components are designed so that beams together form the desired beam. These source subunits can be integrated into a single unit so that they comprise a single unit. For example, the source unit may comprise six LED chips so that there is two LEDs with red, green and blue colors. The combined beam forming components can further have a common beam forming component which improves the performance of the whole unit.

In the source unit of the present invention, the source chip is integrated into a beam forming component. This means that the source chip is surrounded with a substantially transparent material. Depending on the structure of the source chip, it can consist of parts with different refractive indexes. The refractive index of the transparent material can be chosen so that it reduces the reflections from the border of the chip and the transparent material into its minimum, and so raises the external efficiency of the source chip. Typically the refractive index of the transparent material is matched as close to the refractive indexes of the source chip as possible with the available materials and manufacturing processes. In one embodiment of the invention a diffraction grating is manufactured onto the surface of the source chip between the source chip and the transparent material in order to further raise the external efficiency of the source chip.

In one embodiment of the invention the source chip is mounted on a reflective metal surface. The metal layer reflects the downwards emitted light upwards. The other function of the metal layer is to conduct any heat away. A metal mirror can also be deposited onto the surface of some parts of the source chip in order to decrease the etendue. For example, the upper surface of a surface mounted LED chip could be metallized in order to reduce the etendue.

The beam forming component comprises of a transparent material, which surrounds the source chip or source chips and whose refractive index is matched accordingly. The beam forming component comprises at least one diffractive element. Optionally the beam forming component can comprise refractive and reflective components too. Typically all components are integrated together so that the beam forming component comprises a single unit. It is also possible that some elements of the beam forming component are not integrated into the other elements. The refractive and diffractive elements may have antireflection coatings on them, too. The beam forming element may be partially or fully filled with a substantially transparent material.

FIG. 3A shows one embodiment of the source unit comprising a source chip 302 integrated with a a beam forming component. The beam forming component 320 comprises of a transparent material 306 the refractive index of which is near that of the source chip 302. The upper surface of the transparent material has a certain shape and texture. The beam forming component comprises at least one diffractive element 308. Optionally it may also comprise a refractive component 310. A source chip 302 is mounted on a reflecting metal layer 304, which reflects the downwards emitted light.

FIG. 3B presents a structure otherwise similar to that of FIG. 3A, except that the transparent material 306 has a shape of rectangular block with straight sides. This demonstrates the situation without the diffractive and refractive components. The object would be to obtain efficient light beam, which propagates upwards from the source chip. In FIG. 3B only the light 312 which is emitted almost upwards from the chip can avoid total internal reflection, because of the refractive index difference between the block material and air. In addition to that, the out coupled beam is diverged substantially in the border of the transparent material and air. After all, the external efficiency of the source is very low and the out coming beam diverges noticeably.

The diffractive element 308 has a diffractive surface pattern. The surface comprises local diffractive areas which have been optimized so that most of the light coming from the source chip to that area is diffracted into desired direction. For example by using suitable binary or blazed profile, it is possible to obtain, for example, 95% of the light diffracted to the desired direction. The directionality is the better the smaller the source chip is in comparison to the distance from the surface point to the source chip. The out coming beam direction can be designed to be made predetermined by suitable design and by using a various diffractive patterns which vary over the surface. The period, the shape and pattern, the modulation depth and the duty cycle can be set to best fulfil the desired function. Typically just above the source chip the surface is only refractive, whereas elsewhere the surface is diffractive.

In another embodiment of the beam forming component, which is shown in FIG. 3C, the source chip 302 is sunk in a reflector cup. FIG. 3C also shows that the transparent material can also be nearly rectangular in its shape, the surface of which comprise diffractive areas and optionally also refractive areas.

FIG. 3D presents embodiment where the beam forming component consist of a reflective component too. The light emitted from the source chip 302 to the side is reflected from the mirror 314 to the desired direction. The mirror can be planar, parabolic, elliptical, spherical or some other in its shape. There may optionally be diffractive components on the surface of the mirror. The mirror 314 and the metal layer 304 can comprise a single unit. The mirror 314 can also be integrated into the transparent material 306.

FIG. 3E shows another embodiment of the beam forming component, where the mirror is constructed by using the total internal reflection in the border of the transparent material 316. The reflected light is directed through the surface 318 to the desired direction. The surface 318 can contain diffractive and refractive elements.

FIG. 3F shows still another embodiment of the beam forming component. The sidewalls of the transparent material 306 have diffractive and/or refractive surface patterns 308, too.

One embodiment of the source unit comprises of three source chips with red, green and blue colors. All three chips are integrated with the same beam forming component. A beam forming component comprising at least one diffractive element is typically optimized for one color. In this embodiment the optimization is done for all three colors at the same time. In some of the following optical configurations this solution would provide extremely compact device.

The said embodiments of the beam forming component were very simple examples. The structure is not limited only to the presented embodiments, but it can be very complicated depending on the application. The structure of the beam forming component must be very carefully designed according to the said design principles taking into account the whole optical system of the device. It is desired that the beam forming component can be easily mass-produced by well known mass production methods. This adds some constraints and limitations which has to be taken into consideration already in the design phase.

The needed geometrical shape for the refractive and reflective elements can be calculated by using conventional optical design methods. Optical design softwares like Zemax (Zemax Development Corporation, San Diego, Calif., USA) or ray-tracing softwares like TracePro (Lambda Research Inc., Cincinnati, Ohio, USA) may be used in simulations. In principle, the needed geometrical parameters of the diffractive component can be solved analytically in a very simple case. However, the analytical solution is usually too complex in comparison to much faster and simpler numerical modeling. Numerical modeling of diffraction gratings is possible for example by using GSOLVER (Grating Solver Development Company, Allen, Tex., USA) software. GSOLVER utilizes a full 3-dimensional vector code using hybrid Rigorous Coupled Wave Analysis and Modal analysis for solving diffraction efficiencies of arbitrary grating structures for plane wave illumination. In addition to the commercial software, a skilled professional can use conventional programming tools for building more sophisticated modelling tools of his own.

Micro Display:

A micro display can comprise an LCD (liquid crystal device), DMD (digital micro mirror device), or LCoS (liquid crystal on silicon) based spatial modulators or other available micro displays. LCD or LCoS can utilize only one polarization state at time. In LCD micro displays, 20%-40% loss happens due to the gaps between the effective pixels. A better solution is to use a micro-lens array (MLA) with the LCD, i.e. MLA-LCD. The micro-lens array before (and possibly also after) the micro display guides the light through the effective pixel area only. LCD or MLA-LCD must be used in the transmissive micro display configurations because DMD and LCoS micro displays are reflective. On the other hand, LCD can be used also in reflective configurations because a mirror can be positioned behind the LCD screen. The micro display may produce live video images or static images with no movement.

Focusing Unit:

Focusing unit images the image area of the micro display or several micro displays to the target. The target (not shown in the Figures) can be any surface on which the user wants the image to be projected, for example, a wall, a sheet of paper, a book, a screen or the like. The focusing unit can comprise for example a single lens, a Fresnel lens, a single mirror, a diffractive optical element, a hybrid refractive-diffractive element, or a combination of the said components. Preferably the focusing unit comprises of a set of lenses. The components in the focusing unit may have an antireflection coating to reduce reflection losses.

In the virtual display applications, the image area of the micro display or micro displays is imaged to to a virtual plane which can be in the front of or behind it. For example in the virtual display glasses, the projector projects the image into the semireflective glasses so that the image is not formed on the surface of the glasses but for example on the virtual plane 2 meters ahead.

Monochromatic Projector Architectures:

FIG. 4A shows an embodiment of the data projector, which uses only one wavelength band. The data projector comprises the abovementioned source unit 402 with a single color, a transmissive micro display 404 and a focusing unit 406. The source unit 402 provides light to the micro display. The image of the micro display 404 is projected onto the target through the focusing unit 406.

FIG. 4B shows another embodiment of the data projector, which uses only one source unit 402. The data projector comprises a source unit 402, an optional mirror 408 which directs the beam to the DMD micro display 410 which reflects the light through the focusing unit 406 to the target.

FIG. 4C shows still another embodiment of the data projector, which uses only one source unit 402. The data projector comprises a source unit 402, a polarizing beam splitter 414, a LCoS micro display 412 and a focusing unit 406. The other polarization state of the beam is reflected by the polarizing beam splitter to the micro display. The LCoS micro display modulates the polarization of the beam so that the light from the wanted pixels passes through the polarization beam splitter again and gets projected to the target.

There may optionally be a quarter-wave plate 416 between the polarization beam splitter 414 and the micro display 412, which increases the achievable contrast ratio. The contrast ratio can also be improved by using an optional pre-polarizer 418 between the source unit 402 and the polarizing beam splitter 414.

When LCD, MLA-LCD or LCoS-based micro displays are used, the other polarization direction, i.e. 50% of the light is lost. This loss is avoided in an embodiment which is presented in FIG. 5. The beam from a source unit 502 is directed to the polarization beam splitter 504, where the beam is splitted into two directions both consisting of only one linearly polarized light. The both beams illuminate separate LCD micro displays 506, 508. The beams are combined again by using mirrors 510, 512 and the second polarization beam splitter 514. The images of the micro displays are projected onto the target by the focusing unit 516. This way the both polarization states are utilized.

FIG. 6 presents another modification of the previous embodiment in which two LCoS micro displays are used instead of transmissive LCD panels. The beam from the source unit 602 is splitted into two beams in the polarization beam splitter 604. The both beams are reflected from the separate micro displays 606, 608 and according to the polarization modulation of the micro display, the light from the wanted pixels of the micro display is directed to the focusing unit 610. The optional quarter-wave plates 612, 614 can be used to improve the contrast ratio.

The embodiments presented in FIG. 5 and FIG. 6 are especially beneficial in that point that the projector acts both in 2D and 3D mode. The embodiments include two separate micro displays, which can be driven with the same image (2D-mode) or with two separate images which form a stereo-pair (3D-mode).

Still another two embodiments which preserve the both polarization states of the light are presented in FIG. 7 and FIG. 8. In FIG. 7 the light beam from the source unit 702 is divided into two linearly polarized beams by the polarization beam splitter 704. The reflected beam illuminates half of the LCD micro display 706. The transmitted beam from the polarization beam splitter is reflected from the mirror 708 and propagates through the half-wave plate 710 to the other half of the micro display 706. The micro display is then imaged to the target by using the focusing unit 712. The half-wave plate 710 is used to turn the polarization state of the beam 90 degrees so that the beam can pass the micro display 706. The half-wave plate 710 is not needed when the micro display 706 comprises of two separate LCD panels, whose polarization directions are perpendicular to each other.

In principle, FIG. 8 presents a similar embodiment for reflective LCoS micro display. The light beam from the source unit 802 is divided into two linearly polarized beams by the first polarization beam splitter 804. As in FIG. 4C, the polarization of the reflected beam from the first beam splitter is modulated by the first half of the LCoS micro display 806. The light from the wanted pixels of the micro display passes through the beam splitter 804 again and propagates to the focusing unit 808. The transmitted beam from the first polarization beam splitter 804 is reflected by the second polarization beam splitter 810 to the second half of the micro display 806. Similarly this light is modulated by the micro display and projected into the target. This is possible because the polarization directions of the polarization beam splitters 804 and 810 are perpendicular to each other. The embodiments of FIG. 7 and FIG. 8 are very compact but still preserve the both polarization states of the light.

Color Projector Architectures:

Typically three wavelength bands are used in projection, namely red, green and blue. If several wavelength bands are used, the different wavelength bands are modulated with different micro displays, or with different areas of one micro display, or with the same micro display but with different time moments in series, because micro displays are inherently monochromatic.

One embodiment of the color projector includes three single-color projectors which are aligned together so that they form a color image at the target together. This embodiment would consist of three focusing units, which is expensive. A better solution is to use three single-color projectors without the focusing units, combine the beams together and direct the combined beam to a common focusing unit. The combination of the three beams can be done by using X-cube or dichroic mirrors, for example.

FIG. 9A illustrates embodiment wherein three single-color projectors (Red 902R, Green 902G and Blue 902B), based on the embodiment in FIG. 4A, are combined by using a X-cube to form a color projector. The light from the source unit 902R illuminates the LCD micro display 904. The X-cube 906 combines the three beams to one beam which is then projected by the focusing unit 908 into the target.

FIG. 9B presents almost a similar embodiment, wherein the two dichroic mirrors 910, 912 are used instead of the X-cube to beam combination.

The color projectors in FIGS. 9A and 9B were constructed by combining the beams from three single color projectors which was presented in FIG. 4A. Similarly, the color projector can be built by combining three single color projectors of other above mentioned forms. For example, the single color projectors presented in FIGS. 4B, 4C, 5, 6, 7 and 8 can be used to build a color projector similar way.

In the abovementioned color projector architectures several different micro displays (or different areas of the same micro display) was needed. FIG. 10A presents an embodiment where only one micro display is used. The three different light source units 1002B, 1002G and 1002R illuminate the micro display 1004 with red, green and blue beams. There is a beam steering element 1006 front of the micro display which directs the beams with different colors through different pixels. Optionally, there is another beam steering element 1008 after the micro display in order to reduce the divergence of the beam. The beam steering elements can be for example a micro-lens arrays, a lenticular sheets or a micro-prism arrays. The beam steering elements can be integrated with the micro display. The image from the micro display is projected to the target by the focusing unit 1010. The amount of the pixels on the target will be one third of the amount of the pixels of the micro display.

FIG. 10B presents another embodiment of the previous solution. The structure is similar otherwise but the three separate source units 1002B, 1002G and 1002R are replaced by one source unit 1012 which comprises of red, green and blue source chips and which is designed to have a good efficiency for all three colors. One embodiment of the invention combines the configurations presented in FIG. 10A or in FIG. 10B with the polarization preserving ideas of FIGS. 5, 6, 7 or 8.

As mentioned above, it is possible to use only one micro display in a color projector by illuminating it in rapid series one color at a time. This solution simplifies the device configuration substantially. Because a convenient screen would need a refreshing frequency of at least 60 Hz, all colors should be shown during 17 ms time period. When using three colors, this means an illumination time of 5.7 ms per color. The micro display should have a response time short enough. DMD-based micro displays have a response time of under a millisecond, which is enough. The response time of LCoS micro displays is few milliseconds, for example 2.2 ms, which is also enough. The commercial LCD response time is typically 16 ms, but faster ones have already been developed. In a few years the response time of LCD is supposed to go down to 7 ms range which would be enough. It is known that when LEDs are driven in a rapidly pulsed mode, the total averaged optical output power can be the same as when they are driven in DC mode with the same averaged electrical power. Thus pulsing the LEDs affects negatively neither the power efficiency of the system nor the absolute optical power of the system.

The optical configurations of the color projector in which all the colors use the same microdisplay serially are the same that the single-color projector configurations presented in FIGS. 4A, 4B, 4C, 5, 6, 7 and 8, in which the single-color source units are replaced by a three-color source unit. One embodiment of a three-color source unit is a source unit of the innovation comprising of red, green and blue source chips and which is designed to have a good efficiency for all three colors. Another embodiment of a three-color source unit comprises of three single-color source units whose beams are combined by using for example a X-cube or two dichroic mirrors. Some of the preferred embodiments according to these said combinations of single-color projector and three-color source are illustrated in following figures.

FIG. 11 presents one embodiment of the color projector where serial illumination is used. The red, green and blue beams from the three source units 1102B, 1102G and 1102R are combined in a X-cube 1104. As in the FIG. 5, the beam is directed to the polarization beam splitter 1106, where the beam is splitted into two directions both consisting of only one linearly polarized light. The both beams illuminate separate LCD micro displays 1108, 1110. The beams are combined again by using mirrors 1112, 1114 and the second polarization beam splitter 1116. The images of the micro displays are projected onto the target by the focusing unit 1118.

FIG. 12 presents another embodiment of the color projector where serial illumination is used. The red, green and blue beams from the three source units 1202B, 1202G and 1202R are combined in a X-cube 1204. As in the FIG. 6, the beam is splitted into two beams in the polarization beam splitter 1206. The both beams are reflected from the separate LCoS micro displays 1208, 1210 and according to the polarization modulation of the micro display, the light from the wanted pixels of the micro display is directed to the focusing unit 1212. The embodiments in FIG. 11 and FIG. 12 provide 2D/3D-switcable color projector with a compact device configuration.

FIG. 13 presents still another embodiment of the color projector where serial illumination is used. The red, green and blue beams from the three source units 1302B, 1302G and 1302R are combined in a X-cube 1304. As in the FIG. 7, the beam is divided into two linearly polarized beams by the polarization beam splitter 1306. The reflected beam illuminates the first LCD micro display 1308. The transmitted beam from the polarization beam splitter is reflected from the mirror 1310 to the second LCD micro display 1312. The micro displays 1308, 1312 are then imaged to the target by using the focusing unit 1314.

FIG. 14A presents still another embodiment of the color projector where serial illumination is used. The red, green and blue beams from the three source units 1402B, 1402G and 1402R are combined in a X-cube 1404. As in the FIG.

8, the beam is divided into two linearly polarized beams by the first polarization beam splitter 1406. The polarization of the reflected beam from the first beam splitter 1406 is modulated by the first half of the LCoS micro display 1408. The light from the wanted pixels of the micro display passes through the beam splitter 1406 again and propagates to the focusing unit 1410. The transmitted beam from the first polarization beam splitter 1406 is reflected by the second polarization beam splitter 1412 to the second half of the micro display 1408. Similarly this light is modulated by the micro display and projected into the target. This is possible because the polarization directions of the polarization beam splitters 1406 and 1412 are perpendicular to each other.

The embodiments of the invention as they are presented in FIGS. 13 and 14A are suitable only for 2D projection. However by replacing the focusing units 1314 and 1410 by a focusing unit with a beam splitter the embodiments are suitable for both 2D and 3D projection. This is illustrated in FIGS. 14B and 14C. FIG. 14B presents the embodiment of FIG. 14A modified to have both 2D and 3D projection capability. The total internal reflection prisms 1414, 1416 have been added after the focusing unit 1410. The prisms direct the both beams with perpendicular polarization states to the same position on the target so that when viewed through a polarization glasses they produce a 3D-image together.

FIG. 14C presents another embodiment of the beam splitter with the focusing unit. The focusing unit 1410 is replaced by two focusing units 1418, 1420 which are positioned after the beam splitter. By this solution the edges of the projected screen are possibly sharper than by the embodiment presented in FIG. 14B. The beam splitter can also be implemented by using mirrors instead of prisms.

FIG. 15 shows an embodiment of the color projector with the serial illumination, similar to that of presented in FIG. 14 but wherein the X-cube and the three separate source units are replaced by one source unit 1502 which comprises of red, green and blue source chips and which is designed to have a good efficiency for all three colors.

FIG. 16, instead, shows an embodiment of the color projector with the serial illumination, similar to that of presented in FIG. 14 but wherein the X-cube is replaced by two dichroic mirrors 1602, 1604.

FIG. 17 presents an embodiment of the color projector where serial illumination is used. The red, green and blue beams from the three source units 1702B, 1702G and 1702R are combined in a X-cube 1704. As in the FIG. 4B, an optional mirror 1706 directs the beam to the DMD micro display 1708 which reflects the light through the focusing unit 1710 to the target.

Although in the abovementioned color projector embodiments the used colors were red, green and blue, we are not restricted to these colors, but the colors can be any three colors in the visible range. Another choice of colors could be cyan, yellow and magneta, for example. Also, in some applications two colors are enough. In some cases it might be fruitful to use even four or more colors. The combination of such a many colors is possible by using dichroic mirrors for example. It is clear that modifications to the abovementioned optical configurations can be done in the scope of the invention. The abovementioned configurations were included as examples of possible embodiments. Depending on the application, by adding optical components to the abovementioned basic layouts, it is possible to affect to the quality of the projection. For example mirrors, diffractive elements, lenses, optical filters, quarter- and half-wave plates can be added in many positions without changing the basic idea of the invention. In addition to that, optical components can many times be replaced with other components which have similar function, for example mirrors can be replaced by total internal reflection prisms. Many components can be integrated together so that they comprise a single unit. In some applications it is preferably to have all components integrated together for example by using transparent material between the optical components. Abovementioned micro displays can be replaced by other spatial modulators which have suitable functionality.

The data projector of the invention can be used in various projection set-ups. The most straightforward set-up is direct projection, in which the projector projects the image onto a surface, which can be a silver screen, a wall, or a paper for example. The projected image is viewed and illuminated on the same side of the surface. In certain applications it is beneficial to use direct projection to a semitransparent surface which can be semi-reflecting or diffusing surface. Another form of projection is back projection, in which the projector illuminates a semitransparent diffuse surface, which is then viewed on the opposite side of the surface than illuminated. Still another form of projection is virtual screen projection, in which the image of the micro display or micro displays is projected into a virtual plane.

3D-Projection:

In some of the abovementioned embodiments the beam was divided into two perpendicular polarization states which were then modulated separately. This enables to project both polarizations with different images by controlling micro displays separately. Thus it is possible to project both 2D and 3D images with the same projector. When viewing 3D images, polarization glasses are required. In the abovementioned direct projection, the polarization must be preserved in the reflection from the projection surface. This can be achieved by using for example metallized screens. In the back projection set-up the polarization typically preserves without special arrangements or screen materials. FIG. 18 presents a back projection system as an example of 3D projection set-up. The data projector 1802 projects two images with different polarization states to the back projection screen 1804 which is then viewed through the polarization glasses 1806.

Electrical circuits can be implemented by hardware on a circuit board which comprises separate electronic components, by VLSI components (Very Large Scale Integrated Circuit), by FPGA components (Field-Programmable Gate Arrays) or preferably e.g. by ASIC circuit technology (Application Specific Integrated Circuit). Automatic data processing can be carried out in a PC computer or preferably by software run in a processor.

The projection method and data projector according to the invention are particularly suitable for the following uses:
  as a television replacement
  as a computer monitor replacement
  as a video projector
  as a slide presenter/slide projector
  as a virtual display projector The solution of the invention can also be used as an accessory to or integrated into:
  mobile phone
  DVD- and other media players
  video camcorder
  digital camera
  Personal Digital Assistant
  Laptop PC
  handheld and desktop gaming devices
  video conferencing device head mounted display military display multimedia devices at home, hotels, restaurants, cars, airplanes, ships and other vehicles, offices, public buildings such as hospitals, libraries, etc; and other locations any of the abovementioned uses together with 3D imaging software & hardware such as ray tracing, CAD, 3D modeling, 3D capable graphics cards, 3D movies & games for providing 3D viewing of desired objects any other device in which low power consumption, small size and low price are important aspects.

All in all, the present invention leads to a significantly smaller projector configuration, using less power, yielding lower costs and providing higher durability than the existing devices.

Even though the invention is described above with reference to examples according to the accompanying drawings, it is clear that the invention is not restricted thereto but it can be modified in several ways within the scope of the appended claims.

The invention claimed is:

1. A beam forming component disposed in a three dimensional configuration to substantially enclose a hemisphere about a light source, where at least one surface of the beam forming component facing a sidewall of the hemisphere comprises a mirrored surface having non-transmissive micro optical structures.

2. The beam forming component of claim 1, further comprising a micro display disposed adjacent to an optically transmissive surface of the beam forming component.

3. The beam forming component of claim 2, wherein the beam forming component is configured to provide substantially uniform illumination to the micro display.

4. The beam forming component of claim 1, wherein an optically transmissive surface of the beam forming component that encloses the hemisphere, comprises micro optical structures.

5. The beam forming component of claim 1, in combination with a reflective substrate that together substantially envelopes the light source.

6. The beam forming component of claim 1, wherein the light source comprises a light source chip and the beam forming component comprises a transparent material adjacent to the light source chip that has an index of refraction matched to that of the light source.

7. The beam forming component of claim 6, wherein the matched indices of refraction are within about 0.9 of one another.

8. The beam forming component of claim 1 in combination with a micro display, said beam forming component disposed to provide a substantially uniform illumination onto the micro display.

9. The beam forming component of claim 8 disposed to provide a desired projection shape onto the micro display.

10. The beam forming component of claim 1, wherein the micro-optical structures comprise a diffractive grating.

11. The beam forming component of claim 1, wherein the micro-optical structures comprise a refractive grating.

12. The beam forming component of claim 1 wherein the at least one surface comprises a plurality of optically reflective surfaces that form sidewalls about the hemisphere, said plurality of optically reflective surfaces disposed to surround the light source, each of said surfaces comprising micro-optical structures.

13. The beam forming component of claim 12 further comprising a transparent material adjacent to the light source and defining an upper surface that, together with the plurality of surfaces, fully encloses the hemisphere about the light source, wherein said upper surface comprises at least one diffractive component.

14. The beam forming component of claim 12 further comprising a transparent material adjacent to the light source and defining an upper surface that, together with the plurality of surfaces, fully encloses the hemisphere about the light source, wherein said upper surface further comprises at least one refractive component.

15. The beam forming component of claim 13 wherein the upper surface is planar.

16. The beam forming component of claim 13 wherein the upper surface is arcuate.

17. The beam forming component of claim 12, wherein each of the plurality of surfaces are planar.

18. The beam forming component of claim 12, wherein each of the plurality of surfaces are arcuate.

19. The beam forming component of claim 18, wherein at least some of the arcuate surfaces are parabolic.

* * * * *

UNITED STATES PATENT AND TRADEMARK OFFICE
CERTIFICATE OF CORRECTION

PATENT NO. : 7,270,428 B2
APPLICATION NO. : 11/407829
DATED : September 18, 2007
INVENTOR(S) : Alasaarela et al.

It is certified that error appears in the above-identified patent and that said Letters Patent is hereby corrected as shown below:

In Claim 11, column 16, line 13, delete "grating" and insert --surface pattern--.

Signed and Sealed this

First Day of January, 2008

JON W. DUDAS
*Director of the United States Patent and Trademark Office*